US009659901B2

(12) United States Patent
Hikasa

(10) Patent No.: US 9,659,901 B2
(45) Date of Patent: May 23, 2017

(54) SEMICONDUCTOR DEVICE INCLUDING SENSE INSULATED-GATE BIPOLAR TRANSISTOR

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 195 days.

(21) Appl. No.: 14/710,184

(22) Filed: May 12, 2015

(65) Prior Publication Data

US 2015/0325558 A1  Nov. 12, 2015

(30) Foreign Application Priority Data

May 12, 2014 (JP) .................................... 2014-98921
May 11, 2015 (JP) .................................... 2015-96808

(51) Int. Cl.
*H01L 29/04* (2006.01)
*H01L 23/00* (2006.01)
(Continued)

(52) U.S. Cl.
CPC .......... *H01L 24/49* (2013.01); *H01L 23/4824* (2013.01); *H01L 23/49562* (2013.01); *H01L 24/06* (2013.01); *H01L 25/16* (2013.01); *H01L 27/0823* (2013.01); *H01L 29/04* (2013.01); *H01L 29/16* (2013.01); *H01L 29/417* (2013.01); *H01L 29/41708* (2013.01); *H01L 29/739* (2013.01); *H01L 29/7397* (2013.01); *H01L 29/861* (2013.01); *H01L 23/4006* (2013.01); *H01L 24/05* (2013.01); *H01L 24/29* (2013.01);
(Continued)

(58) Field of Classification Search
CPC ........... H01L 23/4824; H01L 23/49562; H01L 24/06; H01L 24/49; H01L 25/16; H01L 29/04
See application file for complete search history.

(56) References Cited

U.S. PATENT DOCUMENTS

| 5,729,032 A | 3/1998 | Tomomatsu et al. |
| 2011/0062514 A1 | 3/2011 | Takano |
| 2014/0159054 A1 | 6/2014 | Otake et al. |

FOREIGN PATENT DOCUMENTS

| JP | 07-240516 A | 9/1995 |
| JP | 2001-118987 A | 4/2001 |

(Continued)

*Primary Examiner* — Matthew Gordon
(74) *Attorney, Agent, or Firm* — Rabin & Berdo, P.C.

(57) ABSTRACT

A semiconductor device of the present invention includes a semiconductor layer including a main IGBT cell and a sense IGBT cell connected in parallel to each other, a first resistance portion having a first resistance value formed using a gate wiring portion of the sense IGBT cell and a second resistance portion having a second resistance value higher than the first resistance value, a gate wiring electrically connected through mutually different channels to the first resistance portion and the second resistance portion, a first diode provided between the gate wiring and the first resistance portion, a second diode provided between the gate wiring and the second resistance portion in a manner oriented reversely to the first diode, an emitter electrode disposed on the semiconductor layer, electrically connected to an emitter of the main IGBT cell, and a sense emitter electrode disposed on the semiconductor layer, electrically connected to an emitter of the sense IGBT cell.

13 Claims, 16 Drawing Sheets

(51) Int. Cl.
 *H01L 25/16*   (2006.01)
 *H01L 29/861*   (2006.01)
 *H01L 29/739*   (2006.01)
 *H01L 29/16*   (2006.01)
 *H01L 29/417*   (2006.01)
 *H01L 27/082*   (2006.01)
 *H01L 23/495*   (2006.01)
 *H01L 23/482*   (2006.01)
 *H01L 23/40*   (2006.01)

(52) U.S. Cl.
 CPC .............. *H01L 24/32* (2013.01); *H01L 24/45* (2013.01); *H01L 24/48* (2013.01); *H01L 27/0825* (2013.01); *H01L 2224/05552* (2013.01); *H01L 2224/05554* (2013.01); *H01L 2224/0603* (2013.01); *H01L 2224/291* (2013.01); *H01L 2224/32245* (2013.01); *H01L 2224/45124* (2013.01); *H01L 2224/48091* (2013.01); *H01L 2224/48101* (2013.01); *H01L 2224/48137* (2013.01); *H01L 2224/48247* (2013.01); *H01L 2224/48472* (2013.01); *H01L 2224/4903* (2013.01); *H01L 2224/49111* (2013.01); *H01L 2224/49113* (2013.01); *H01L 2224/49175* (2013.01); *H01L 2224/73265* (2013.01); *H01L 2924/1203* (2013.01); *H01L 2924/13055* (2013.01); *H01L 2924/13091* (2013.01); *H01L 2924/181* (2013.01); *H01L 2924/1815* (2013.01)

(56) References Cited

FOREIGN PATENT DOCUMENTS

| | | |
|---|---|---|
| JP | 3741002 B2 | 2/2006 |
| JP | 2009-117786 A | 5/2009 |
| JP | 2011-066121 A | 3/2011 |
| JP | 2012-059927 A | 3/2012 |
| JP | 2013-258387 A | 12/2013 |
| JP | 2014-017961 A | 1/2014 |
| JP | 2014-022580 A | 2/2014 |

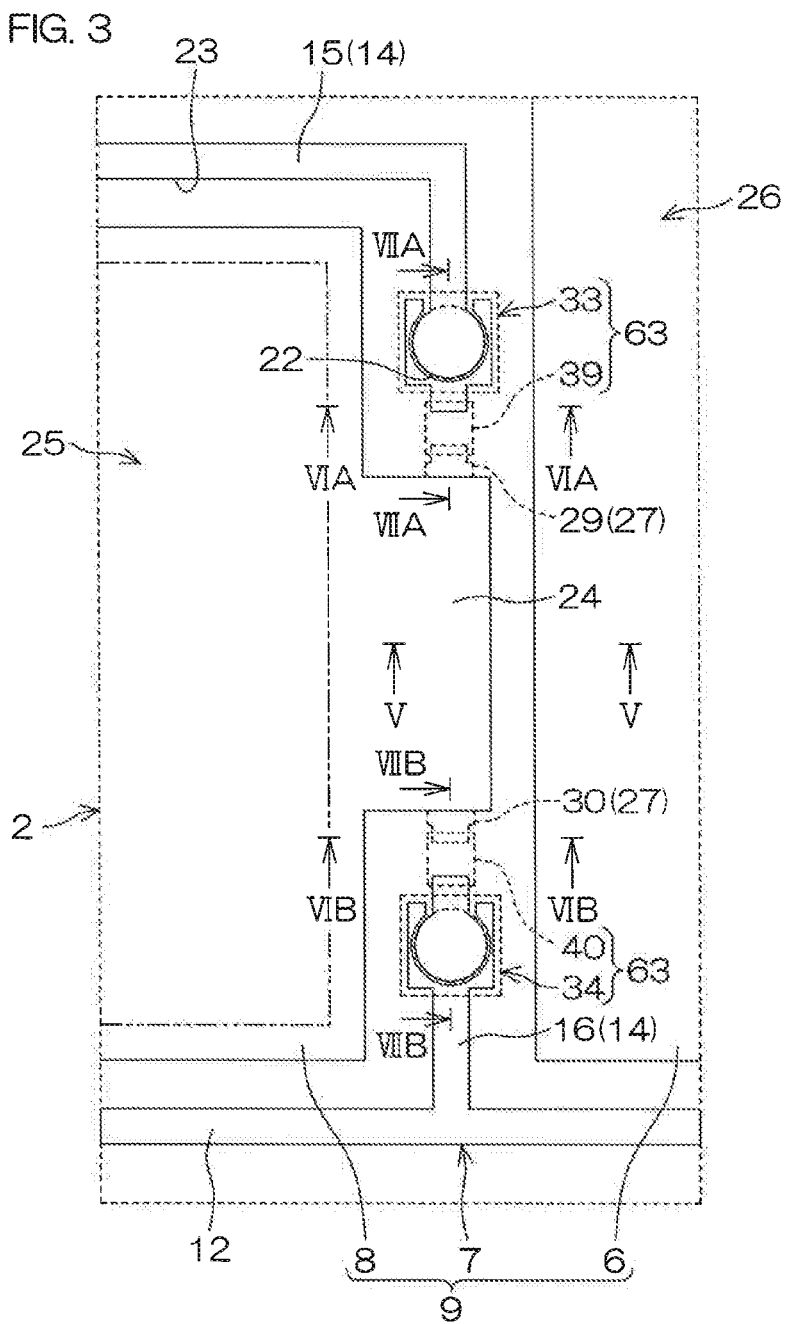

FIG. 4A
Sense IGBT Cell Pattern
FIG. 4B
Main IGBT Cell Pattern
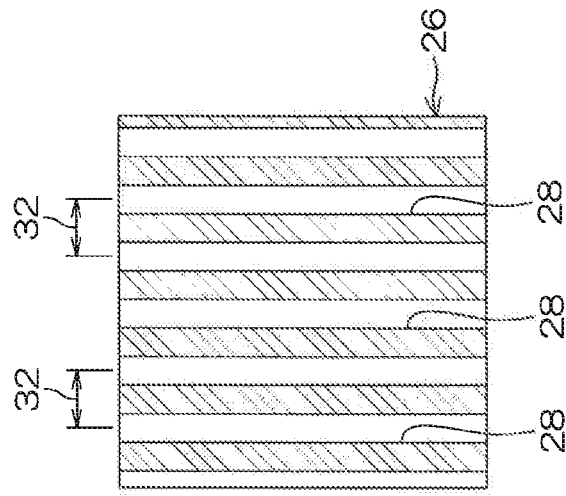
FIG. 4C
Cell Pattern Modification
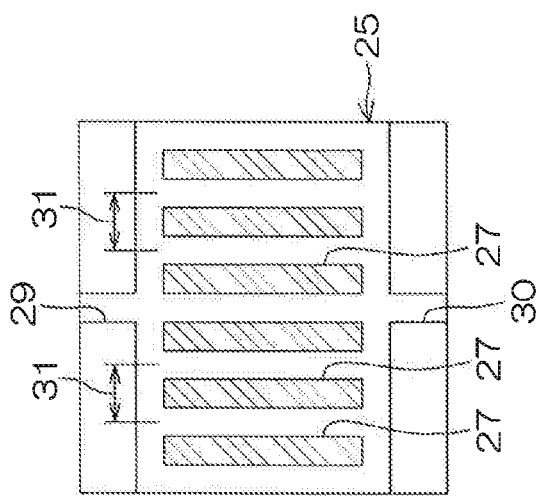

Turn-on Operation : Small RG

Turn-off Operation : Large RG

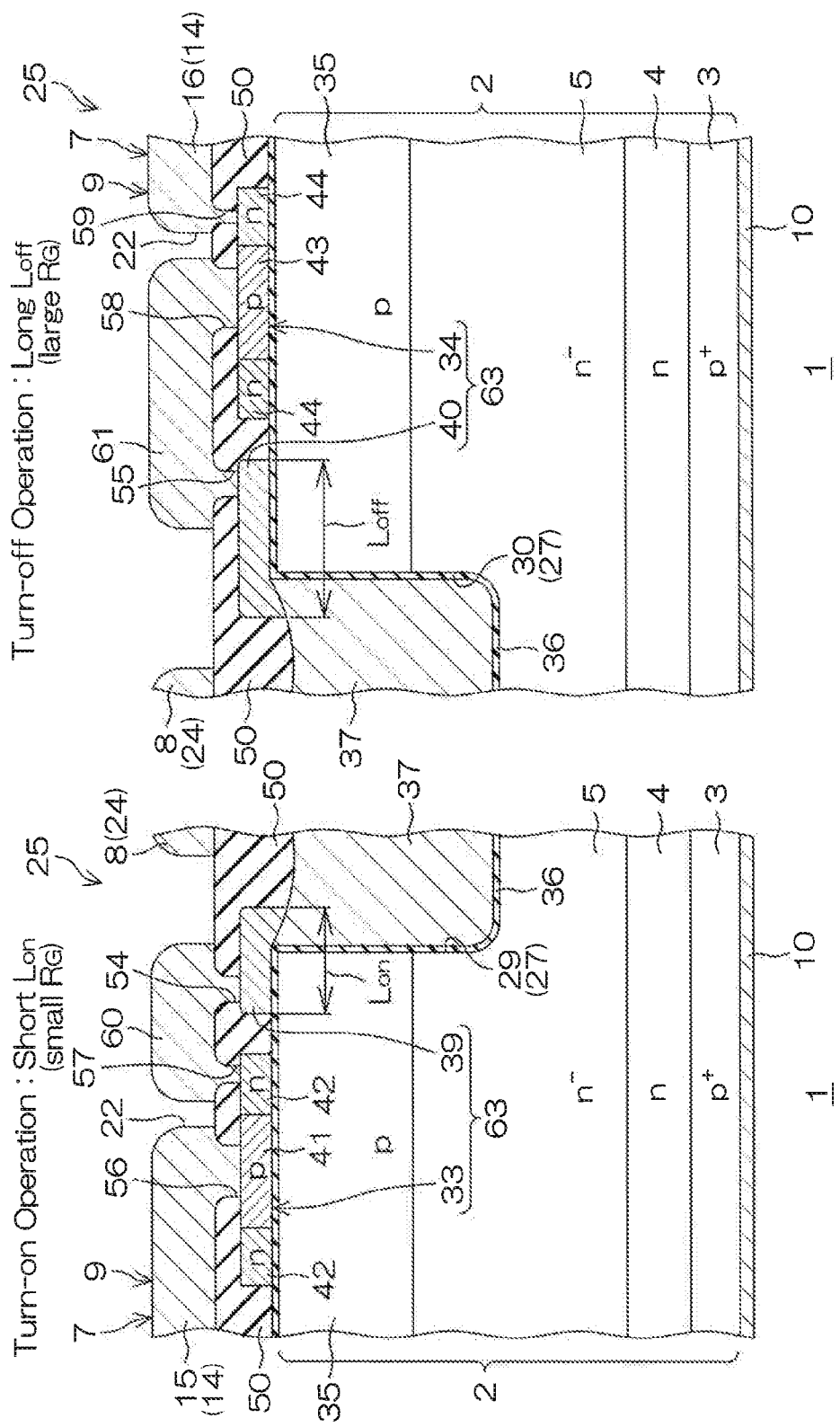

Diode Modification

Only Polysilicon

Polysilicon Plus Metal

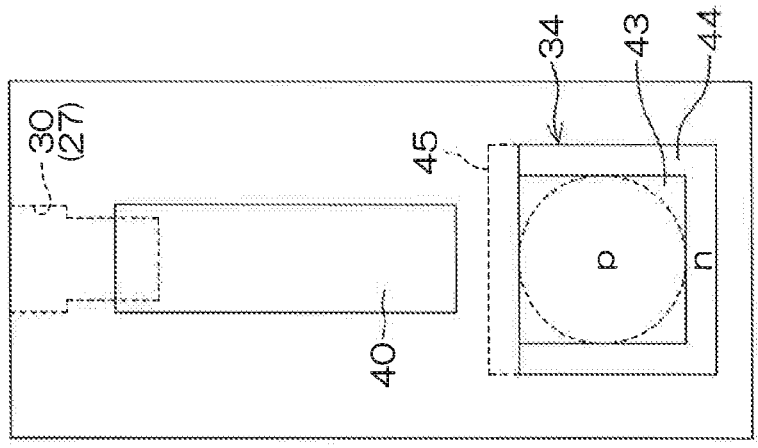
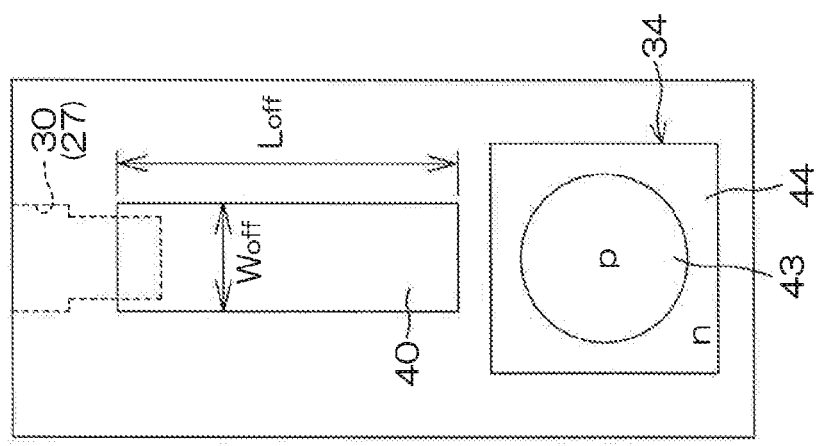
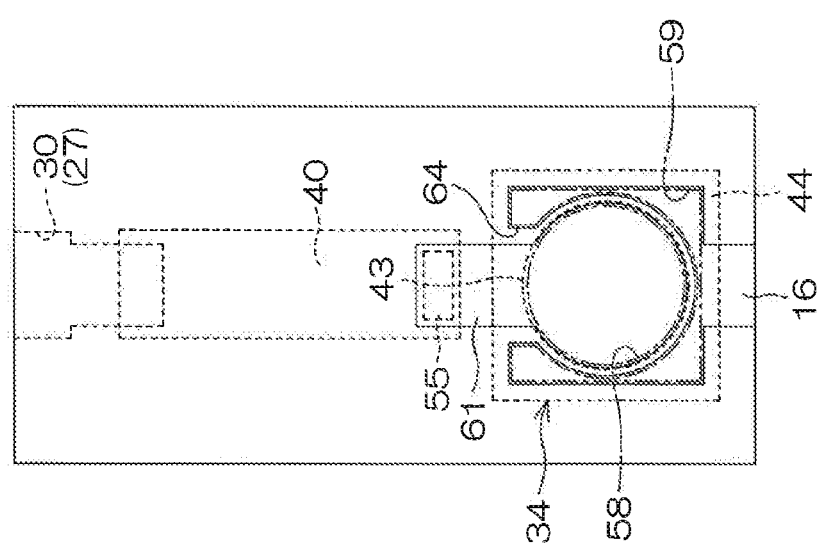

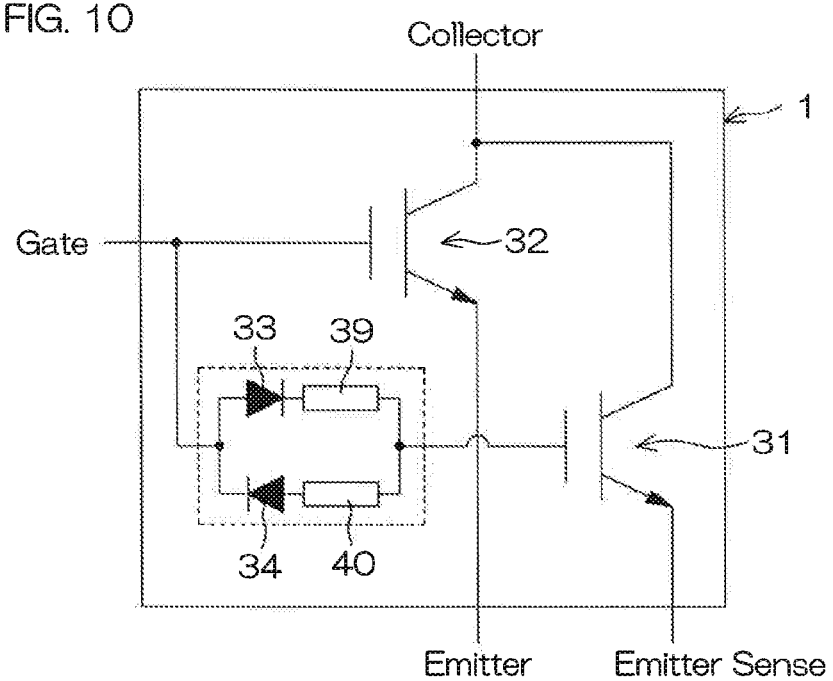

SEMICONDUCTOR DEVICE INCLUDING SENSE INSULATED-GATE BIPOLAR TRANSISTOR

CROSS-REFERENCE TO RELATED APPLICATIONS

The present application corresponds to Japanese Patent Application No. 2014-98921 filed in the Japan Patent Office on May 12, 2014 and Japanese Patent Application No. 2015-96808 filed in the Japan Patent Office on May 11, 2015, and the entire disclosures of these applications are incorporated herein by reference.

TECHNICAL FIELD

The present invention relates to a semiconductor device including a sense insulated-gate bipolar transistor (IGBT).

BACKGROUND ART

Semiconductor devices including sense IGBTs to monitor if a main IGBT current (main current) is excessively large are disclosed in Patent Document 1 (Japanese Patent Application Publication No. 7-240516), Patent Document 2 (Japanese Patent Application Publication No. 2009-117786), and Patent Document 3 (Japanese Patent Application Publication No. 2011-66121).

SUMMARY OF INVENTION

Unlike MOSFETs, it is difficult for IGBTs being bipolar elements to have current monitoring patterns standardized by a mask ratio (sense current ratio).

Also, depending on the layout of a main IGBT and a sense IGBT, a Hall current flows from the outer periphery of an active region for the main IGBT into the sense IGBT in some cases. In that case, an overcurrent may flow to the sense IGBT due to a shift in switching phase from an emitter of the main IGBT and the like. Because the sense IGBT stops the system when a predetermined overcurrent flows as a role of current monitoring, the temporary overcurrent causes a malfunction. Therefore, conventionally, introduction of a filter circuit and margin design such as setting a high overcurrent detection value have been necessary in order to avoid a malfunction, and as a result, there has been a problem that the sensitivity of the sense IGBT declines.

It is an object of the present invention to provide a semiconductor device capable of suppressing an overcurrent different from an overcurrent that needs to be primarily detected from flowing to a sense IGBT at the turn-on time, and capable of gradually performing a switching operation at the turn-off time.

BRIEF DESCRIPTION OF DRAWINGS

FIG. 3 is an enlarged view of a part surrounded by the broken line III in FIG. 2.

FIGS. 4A to 4C are schematic views showing cell patterns of a sense IGBT cell region and a main IGBT cell region.

FIGS. 7A and 7B are sectional views presented when the semiconductor device is cut along a cutting line VIIA-VIIA and a cutting line VIIB-VIIB in FIG. 3, respectively.

FIGS. 9A to 9C are schematic views for explaining arrangements of an OFF-side diode.

FIG. 10 is an equivalent circuit diagram of the semiconductor device.

DESCRIPTION OF EMBODIMENTS

Figure 1:
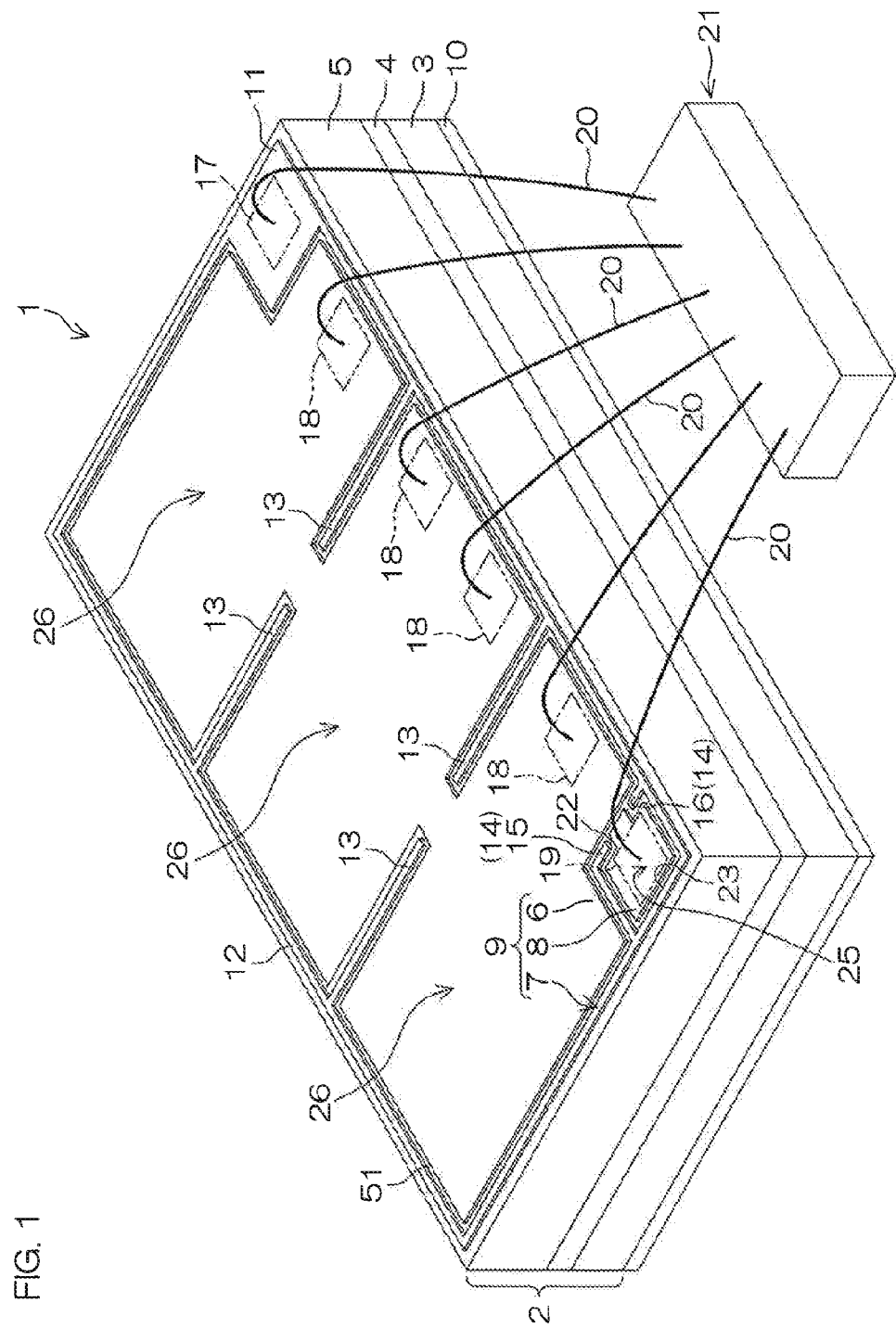
FIG. 1 is a schematic perspective view of a semiconductor device according to a preferred embodiment of the present invention.

The semiconductor device of the present invention includes a semiconductor layer including a main IGBT cell and a sense IGBT cell connected in parallel to each other, a first resistance portion having a first resistance value formed using a gate wiring portion of the sense IGBT cell and a second resistance portion having a second resistance value higher than the first resistance value, a gate wiring electrically connected through mutually different channels to the first resistance portion and the second resistance portion, a first diode provided between the gate wiring and the first resistance portion, a second diode provided between the gate wiring and the second resistance portion in a manner oriented reversely to the first diode, an emitter electrode disposed on the semiconductor layer, electrically connected to an emitter of the main IGBT cell, and a sense emitter electrode disposed on the semiconductor layer, electrically connected to an emitter of the sense IGBT cell.

According to this arrangement, the first diode and the second diode are electrically connected to the respective resistance portions in a manner oriented reversely to each other. It can thereby be selectively designated according to the polarity (positive/negative) of a voltage that is applied to the gate wiring portion whether through a first diode channel or a second diode channel a sense gate voltage is applied.

If an arrangement is provided such that the first diode channel becomes conductive when turning on the main IGBT, at the turn-on time, a sense gate voltage is applied through the first resistance portion (first gate resistance) having a relatively low resistance. Thus, designing the first resistance value $R_{g1}$ at the same level as a gate resistance $R_{gm}$ of the main IGBT allows bringing a timing at which the sense IGBT is turned on close to a timing at which the main IGBT is turned on. As a result, a phase shift (phase difference) therebetween can be reduced, so that flow of an unexpected overcurrent to the sense IGBT can be suppressed. Accordingly, current noise at the turn-on time can be reduced.

On the other hand, at the turn-off time of the main IGBT, the second diode channel becomes conductive, and a sense gate voltage is applied through the second resistance portion (second gate resistance) having a relatively high resistance. It can thereby be suppressed that a Hall current flows to the sense IGBT. Therefore, current noise at the turn-off time can be reduced, and the main IGBT can be gradually turned off (softly turned off).

As a result of the above, introduction of a filter circuit and margin design such as setting a high overcurrent detection value for avoiding a malfunction can be made unnecessary. Because a gate driver can thereby be improved in detection sensitivity, the performance of a system including the semiconductor device of the present invention can be improved.

The gate wiring portion of the sense IGBT cell may include a gate electrode formed with a predetermined wiring pattern to divide the sense IGBT cell into respective cell units, and the first resistance portion and the second resistance portion may be disposed on peripheral edge portions of the gate electrode, respectively.

The gate electrode may include a striped pattern, and the first resistance portion and the second resistance portion may be disposed on one end portion of the gate electrode in the striped pattern and the other end portion on a side opposite to the one end portion, respectively.

The first resistance portion may have a short wiring length compared to that of the second resistance portion.

The first resistance portion may have a wide wiring width compared to that of the second resistance portion.

According to this arrangement, by adjusting each of the first resistance portion and the second resistance portion in wiring length and wiring width, a difference in resistance value can be simply provided therebetween.

The first diode may be formed of a first deposition layer disposed on the semiconductor layer, having a central portion of a first conductivity type and a peripheral edge portion of a second conductivity type enclosing the central portion, and the second diode is formed of a second deposition layer disposed on the semiconductor layer, having a central portion of a first conductivity type and a peripheral edge portion of a second conductivity type enclosing the central portion.

According to this arrangement, by depositing and patterning a semiconductor material, the first diode and the second diode can be simply fabricated.

Any one or both of the peripheral edge portion of the first deposition layer and the peripheral edge portion of the second deposition layer may be formed so as to enclose an entire circumference of the central portion inside thereof, respectively.

According to this arrangement, p-n junctions can be formed across the entire circumferences of the respective central portions of one or both of the first deposition layer and the second deposition layer, so that the occurrence of a leak current can be suppressed.

Any one or both of the peripheral edge portion of the first deposition layer and the peripheral edge portion of the second deposition layer may be formed so as to selectively enclose a part of the central portion inside thereof, respectively.

According to this arrangement, any one or both of the first diode and the second diode can be downsized as compared with when the entire circumference of the central portion is enclosed by the peripheral edge portion. As a result, the degree of freedom in the layout of any one or both of the first diode and the second diode can be increased.

Any one or both of the first deposition layer and the second deposition layer may be made of doped polysilicon.

Because being made of doped polysilicon allows for easy processing (such as patterning) by an existing technique, any one or both of the first and second diodes can be fabricated with efficiency.

The gate wiring may be connected to the central portion of the first deposition layer and the peripheral edge portion of the second deposition layer, and the semiconductor device may include a first contact wiring that connects the peripheral edge portion of the first deposition layer and the first resistance portion and a second contact wiring that connects the central portion of the second deposition layer and the second resistance portion.

The first resistance portion and the second resistance portion may be formed using a deposition layer that is the same as the first deposition layer and the second deposition layer.

According to this arrangement, because the respective diodes and the respective resistance portions can be simultaneously formed, the manufacturing efficiency can be improved.

The gate wiring may include a main line portion and a first branching portion and a second branching portion branching off the main line portion, and the first branching portion and the second branching portion may be connected to the first diode and the second diode, respectively.

The semiconductor device may include a collector electrode disposed on a back surface of the semiconductor layer, being common between the main IGBT and the sense IGBT.

Hereinafter, preferred embodiments of the present invention will be described in detail with reference to the accompanying drawings. In the accompanying drawings, for the sake of clarification, dimensional ratios among components are sometimes changed from figure to figure for illustration.

Figure 2:
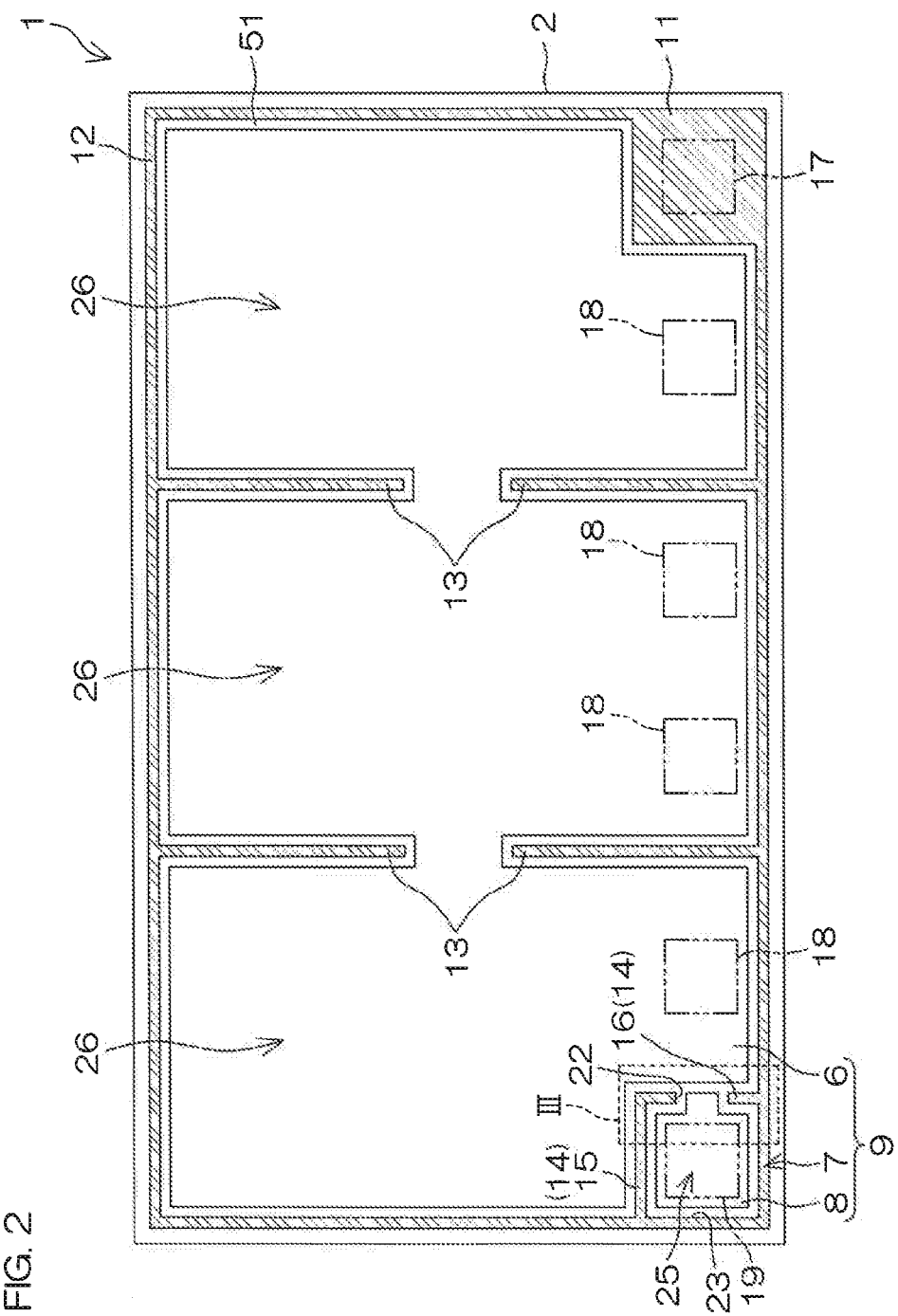
FIG. 2 is a schematic plan view of the semiconductor device in FIG. 1.

FIG. 1 is a schematic perspective view of a semiconductor device 1 according to a preferred embodiment of the present invention. FIG. 2 is a schematic plan view of the semiconductor device 1 in FIG. 1. In FIG. 2, a gate wiring 7 is hatched for clarification.

The semiconductor device 1 has a basic form as a trench gate type IGBT. The semiconductor device 1 includes a semiconductor substrate 2 as an example of a semiconductor layer of the present invention. The semiconductor substrate 2 has a structure in which a $p^+$-type collector region 3, an n-type buffer region 4, and an $n^-$-type drift region 5 are laminated in order from its back surface toward its front surface.

On the semiconductor substrate 2, an electrode film 9 including a main emitter electrode 6, a gate wiring 7, and a sense emitter electrode 8 is formed. On the back surface of the semiconductor substrate 2, a collector electrode 10 is formed substantially entirely thereacross. The semiconductor substrate 2 is formed in, for example, a rectangular shape in a plan view, and the semiconductor device 1 accordingly has a rectangular shape in a plan view.

The electrode film 9 is formed in a rectangular region extending substantially the entirety of the front surface of the semiconductor substrate 2.

The gate wiring 7 includes a pad portion 11 formed in a corner portion of the semiconductor device 1, an outer peripheral wiring portion 12 as an example of a main line portion of the present invention formed across the entire circumference of an outer peripheral portion of a front surface of the semiconductor device 1, a plurality of (in the present preferred embodiment, four) main gate finger portions 13 extending from the outer peripheral wiring portion 12 toward an inner region of the front surface of the semiconductor device 1, and a plurality of (in the present preferred embodiment, two) sense gate finger portions 14 that are likewise extending from the outer peripheral wiring portion 12 toward an inner region of the front surface of the semiconductor device 1.

The front surface of the semiconductor device 1 has an oblong shape having a pair of short sides and a pair of long sides connecting the short sides, and accordingly, the outer peripheral wiring portion 12 is formed in an oblong ring shape.

The main gate finger portions 13 are formed such that two each extend parallel to each other at an interval therebetween from the pair of long side parts of the outer peripheral wiring portion 12.

The sense gate finger portions 14 are formed one each from the long side part and short side part composing a corner portion of the outer peripheral wiring portion 12 such that a predetermined pad region 23 is defined inside thereof. One and the other of the sense gate finger portions 14 are, respectively, an ON-side finger 15 and an OFF-side finger 16 as an example of a first branching portion and second branching portion of the present invention. The ON-side finger 15 and the OFF-side finger 16 are opposed such that an open portion 22 to open a part of the pad region 23 is formed between each other's distal end portions.

The sense emitter electrode 8 is disposed in a corner portion (pad region 23) of the semiconductor substrate 2 enclosed by the sense gate finger portions 14 and the corner portion of the outer peripheral wiring portion 12, and the main emitter electrode 6 is disposed in a region covering substantially the entirety of the semiconductor substrate 2 enclosed by the outer peripheral wiring portion 12 outside of said corner portion. The main emitter electrode 6, the gate wiring 7, and the sense emitter electrode 8 are formed in a mutually isolated state. In each section between the electrodes 6 to 8, a separation region 51 for isolation therebetween is formed.

A passivation film (not shown) is formed in a manner covering the main emitter electrode 6, the gate wiring 7, and the sense emitter electrode 8 and the front surface of the semiconductor substrate 2 exposed from the wiring and electrodes. In the passivation film, as shown by alternate long and two short dashed lines in FIG. 1 and FIG. 2, a gate pad opening 17, main emitter pad openings 18, and a sense emitter pad opening 19 are formed.

The gate pad opening 17 is formed so as to expose a part of the pad portion 11. The main emitter pad opening 18 is formed so as to expose a part of a front surface of the main emitter electrode 6. The sense emitter pad opening 19 is formed so as to expose a part of the sense emitter electrode 8. In the present preferred embodiment, a plurality of (for example, four) main emitter pad openings 18 are arrayed along a long side of the rectangular front surface of the semiconductor device 1.

The semiconductor device 1 is connected to a driver IC 21 (gate driver) to control IGBT operation by bonding wires 20 connected to the pad openings 17 to 19.

FIG. 3 is an enlarged view of a part surrounded by a broken line III in FIG. 2. FIGS. 4A to 4C are schematic views showing cell patterns of a sense cell region 25 and a main cell region 26.

As described above, on the semiconductor substrate 2, the pad region 23 a part of which is opened by the open portion 22 is formed, and the sense emitter electrode 8 is disposed in the pad region 23. The sense emitter electrode 8 has a projection portion 24 projecting from the pad region 23 to the open portion 22. The projection portion 24 is sandwiched by the distal end portion of the ON-side finger 15 and the distal end portion of the OFF-side finger 16. On the other hand, the main emitter electrode 6 is disposed outside of the pad region 23.

Moreover, as front surface regions of the semiconductor substrate 2, the sense cell region 25 is defined under the sense emitter electrode 8, and the main cell region 26 is defined under the main emitter electrode 6.

As shown in FIGS. 4A and 4B, in the sense cell region 25 and the main cell region 26, a plurality of sense side trenches 27 and a plurality of main side trenches 28 are arrayed at equal intervals. Moreover, both ends of each of the sense side trenches 27 and the main side trenches 28 are respectively electrically connected to the outer peripheral wiring portion 12, the main gate finger portion 13, or the sense gate finger portion 14. By the sense side trenches 27 and the main side trenches 28, the sense cell region 25 and the main cell region 26 are defined into sense cells 31 (sense IGBT cells) and main cells 32 (main IGBT cells) in stripe shapes, respectively.

Also, the sense side trenches 27, in the present preferred embodiment, include an ON-side contact portion 29 and an OFF-side contact portion 30 led out from under the open portion 22 toward the ON-side finger 15 and the OFF-side finger 16. That is, the gate wiring 7 is, as shown in FIG. 3, via mutually different channels branched off from the outer peripheral wiring portion 12 being the ON-side finger 15 and the OFF-side finger 16, made to contact the ON-side contact portion 29 and the OFF-side contact portion 30 via resistance wirings 39 and 40 to be described later, respectively.

In addition, the sense side trenches 27 may be, as shown in FIG. 4C, formed in a grid shape in a manner defining matrix-shaped sense cells 31. In this case, it suffices that the ON-side contact portion 29 and the OFF-side contact portion 30 are disposed on peripheral edge portions of a grid-shaped pattern, respectively. Of course, the grid-shaped gate trench pattern can also be applied to the main side trenches 28 of the main cell region 26 (not shown).

As shown in FIG. 3, between the ON-side contact portion 29 and the ON-side finger 15, an ON-side diode 33 as an example of a first diode of the present invention is interposed. On the other hand, between the OFF-side contact portion 30 and the OFF-side finger 16, an OFF-side diode 34 as an example of a second diode of the present invention is interposed.

Next, referring to FIG. 5 to FIGS. 9A, 9B, and 9C, the configuration of the semiconductor device 1 will be described in greater detail.

Figure 5:
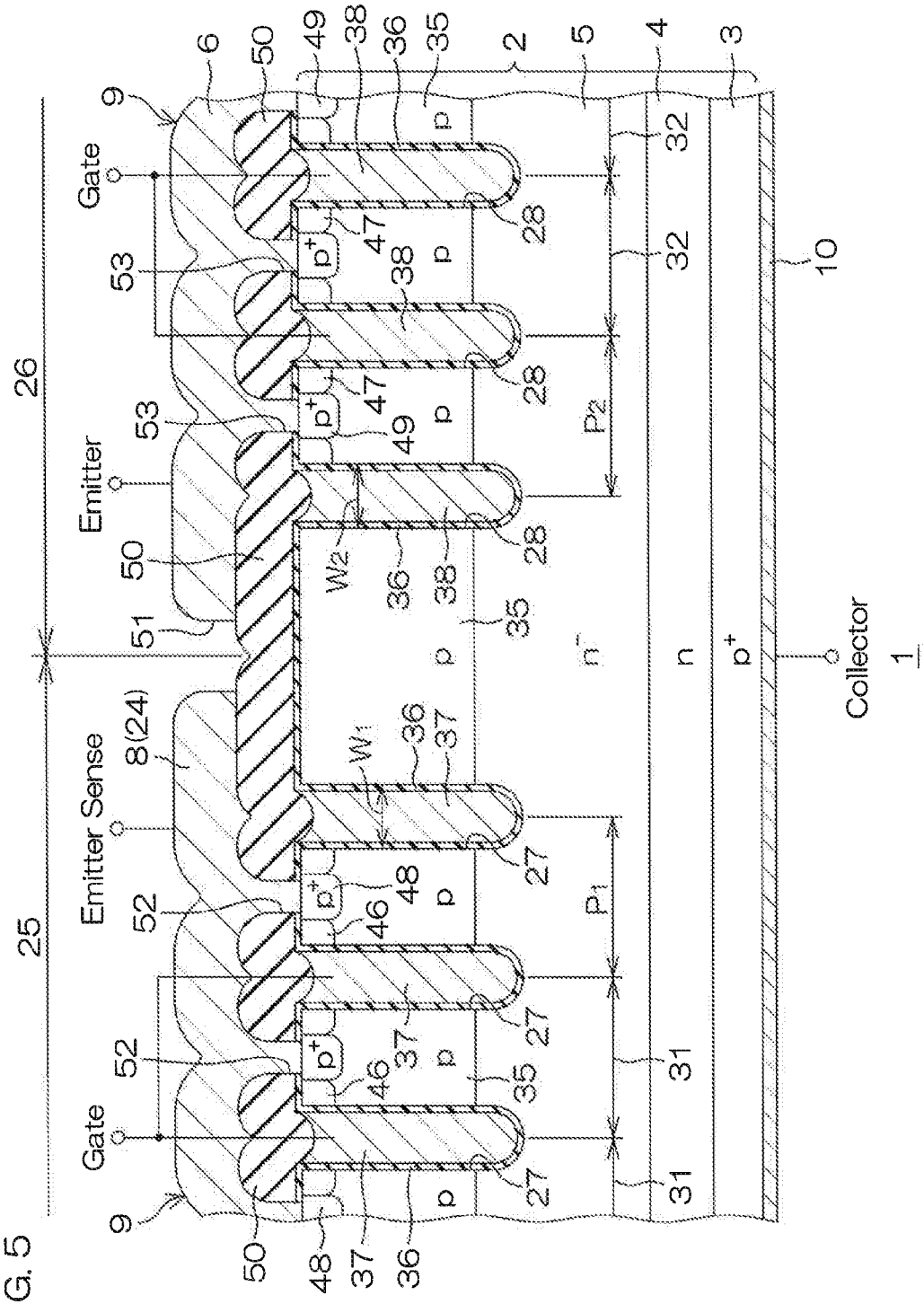
FIG. 5 is a sectional view presented when the semiconductor device is cut along a cutting line V-V in FIG. 3.
Figure 6A:
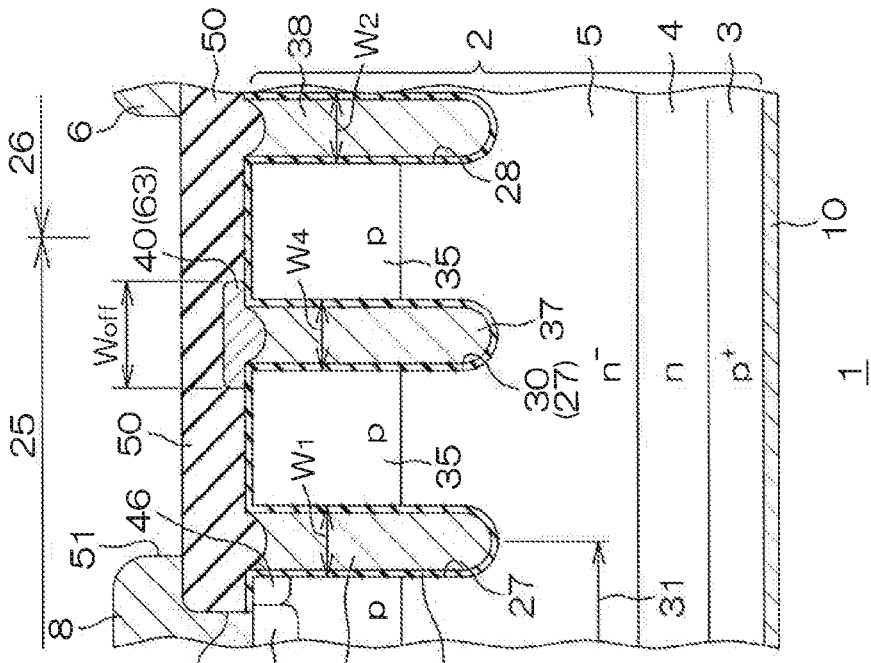
FIGS. 6A and 6B are sectional views presented when the semiconductor device is cut along a cutting line VIA-VIA and a cutting line VIB-VIB in FIG. 3, respectively.
Figure 6B:
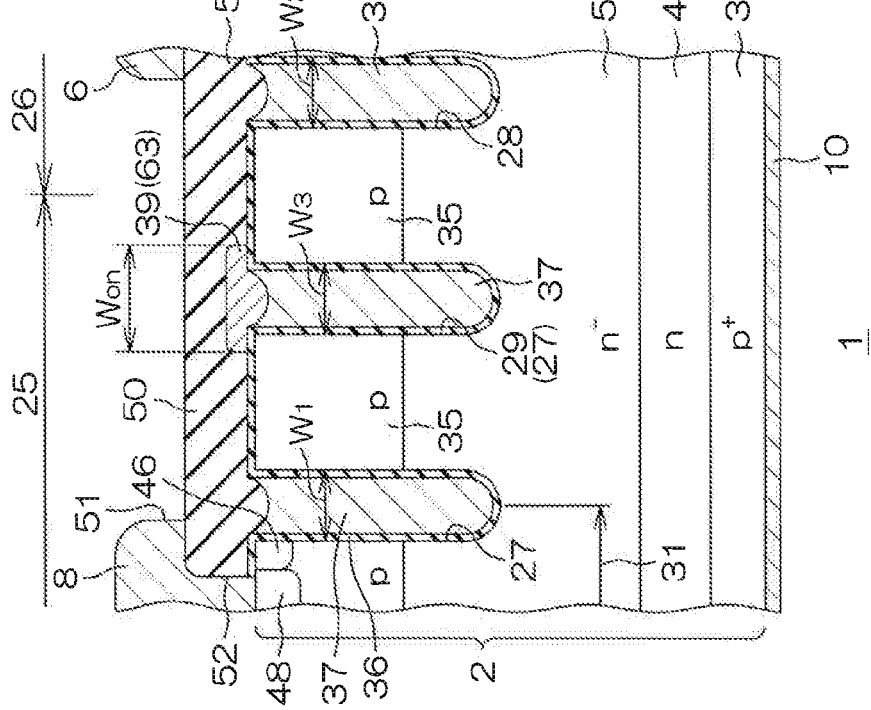
Figure 8C:
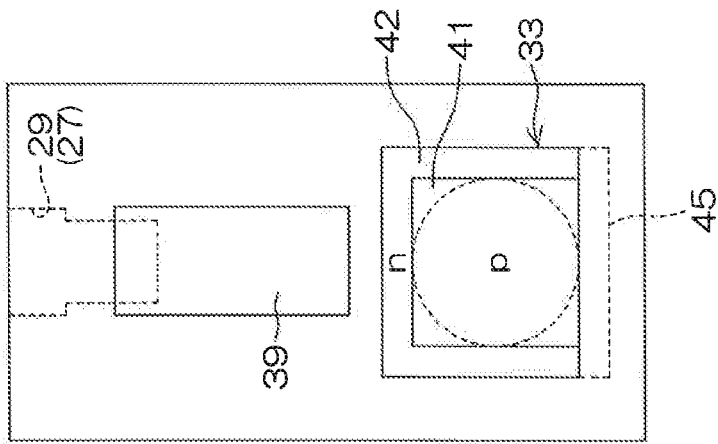
FIGS. 8A to 8C are schematic views for explaining arrangements of an ON-side diode.
Figure 8B:
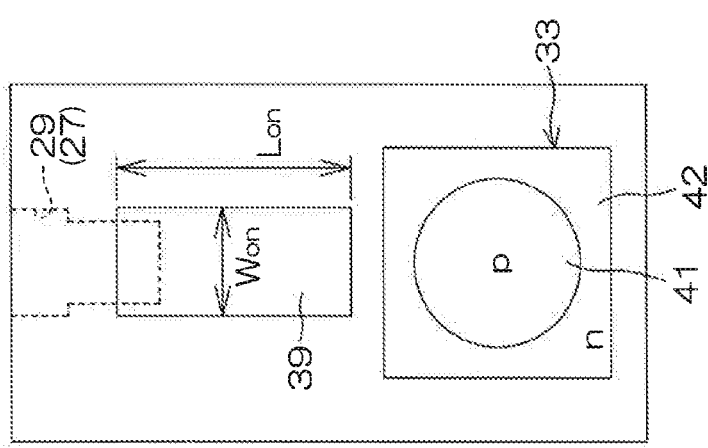
Figure 8A:
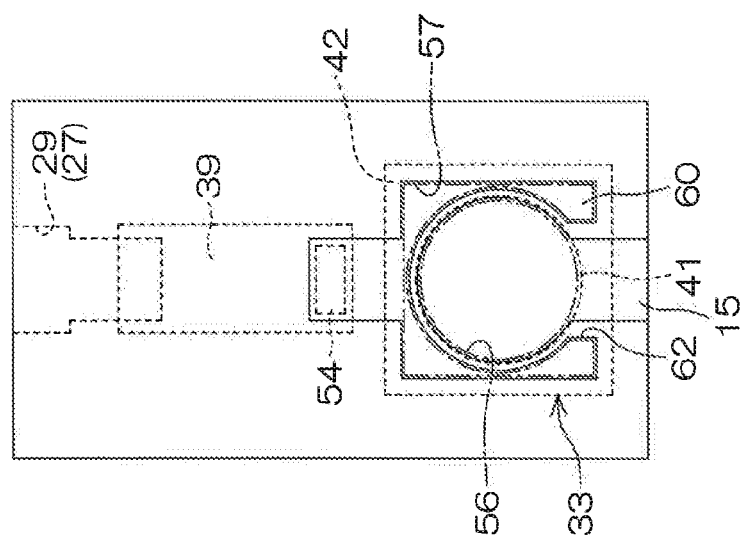

FIG. 5 is a sectional view presented when the semiconductor device 1 is cut along a cutting line V-V in FIG. 3. FIGS. 6A and 6B are sectional views presented when the semiconductor device 1 is cut along a cutting line VIA-VIA and a cutting line VIB-VIB in FIG. 3, respectively. FIGS. 7A and 7B are sectional views presented when the semiconductor device 1 is cut along a cutting line VIIA-VIIA and a cutting line VIIB-VIIB in FIG. 3, respectively. FIGS. 8A to 8C are schematic views for explaining arrangements of the ON-side diode 33. FIGS. 9A to 9C are schematic views for explaining arrangements of the OFF-side diode 34.

The semiconductor substrate 2 may be, for example, an $n^-$-type silicon substrate having a thickness of 50 μm to 200 μm. The semiconductor substrate 2, as described above, has a structure in which the $p^+$-type collector region 3, the n-type buffer region 4, and the $n^-$-type drift region 5 are laminated.

As a p-type dopant of the p$^+$-type collector region 3, for example, B (boron), Al (aluminum), and the like can be used (hereinafter, the same applies top-type impurity regions). On the other hand, as an n-type dopant of the n-type buffer region 4 and the n$^-$-type drift region 5, for example, N (nitride), P (phosphorous), As (arsenic), and the like can be used (hereinafter, the same applies to n-type impurity regions).

Also, the p$^+$-type collector region 3 has a dopant concentration of, for example, $1\times10^{15}$ cm$^{-3}$ to $2\times10^{19}$ cm$^{-3}$. On the other hand, the n-type buffer region 4 has a dopant concentration of, for example, $1\times10^{15}$ cm$^{-3}$ to $5\times10^{17}$ cm$^{-3}$, and the n$^-$-type drift region 5 has a dopant concentration of, for example, $1\times10^{13}$ cm$^{-3}$ to $5\times10^{14}$ cm$^{-3}$.

In a front surface portion of the n$^-$-type drift region 5, a p-type base region 35 is formed. The p-type base region 35 is formed substantially across the entire region of the semiconductor substrate 2 in a manner extending across the sense cell region 25 and the main cell region 26. The p-type base region 35 has a dopant concentration of, for example, $1\times10^{16}$ cm$^{-3}$ to $1\times10^{18}$ cm$^{-3}$. Also, the p-type base region 35 has a depth of, for example, 1.0 μm to 3.0 μm from its front surface.

Moreover, the sense side trenches 27 and the main side trenches 28 are formed in a manner extending from the front surface of the semiconductor substrate 2 beyond a bottom portion of the p-type base region 35. The p-type base regions 35 between adjacent sense side trenches 27 and adjacent main side trenches 28 are thereby respectively divided in stripe shapes. The divided stripe-shaped semiconductor regions (Si crystal regions) are defined as an active region of a sense IGBT and an active region of a main IGBT, respectively.

As shown in FIG. 5, the interval $P_1$ between the adjacent sense side trenches 27 (center to center distance of the sense side trenches 27) is, for example, 1.5 μm to 7.0 μm. Also, the width $W_1$ of the sense side trench 27 is, for example, 0.5 μm to 1.5 μm. Also, the interval $P_2$ between the adjacent main side trenches 28 (center to center distance of the main side trenches 28) and the width $W_2$ of the main side trench 28 are the same as the interval $P_1$ between the sense side trenches 27 and the width $W_1$ of the sense side trench 27, respectively.

On an inner surface of the sense side trench 27 and the main side trench 28 and the front surface of the semiconductor substrate 2, a gate insulating film 36 is integrally formed. The gate insulating film 36 is made of, for example, SiO$_2$. Also, the gate insulating film 36 has a thickness of, for example, 1100 Å to 1300 Å (in the present preferred embodiment, 1200 Å).

Moreover, in the respective trenches 27 and 28, an electrode material made of, for example, polysilicon or the like is buried via the gate insulating film 36. Thereby, a sense side gate electrode 37 is formed in the sense side trenches 27, and a main side gate electrode 38 is formed in the main side trenches 28. The respective electrodes (resistance portions) 37 and 38 are, in the present preferred embodiment, buried up to opening ends of the respective trenches 27 and 28, respectively.

In a front surface portion of the p-type base region 35 of each of the sense cells 31 and the main cells 32, an n$^+$-type emitter region 46, 47 is formed. The n$^+$-type emitter region 46, 47 has a depth of, for example, 0.2 μm to 0.6 μm. Also, the n$^+$-type emitter region 46, 47 has a dopant concentration of $1\times10^{19}$ cm$^{-3}$ to $5\times10^{20}$ cm$^{-3}$.

Also, in a front surface portion of the p-type base region 35 of each of the sense cells 31 and the main cells 32, a p$^+$-type base contact region 48, 49 is formed. The p$^+$-type base contact region 48, 49 is formed in a manner extending from the front surface of the semiconductor substrate 2 beyond a bottom portion of the n$^+$-type emitter region 46, 47. The p$^+$-type base contact region 48, 49 has a depth of, for example, 0.2 μm to 0.8 μm. Also, the p$^+$-type base contact region 48, 49 has a dopant concentration of, for example, $5\times10^{18}$ cm$^{-3}$ to $1\times10^{20}$ cm$^{-3}$.

As shown in FIGS. 6A and 6B and FIGS. 7A and 7B, on the gate insulating film 36 in the front surface region of the semiconductor substrate 2, a wiring film 63 including the ON-side diode 33, the OFF-side diode 34, the ON-side resistance wiring 39, and the OFF-side resistance wiring 40 is formed. The wiring film 63 is formed of deposition layers (a first deposition layer and a second deposition layer) of doped polysilicon, and is insulated by the gate insulating film 36 with respect to the semiconductor substrate 2. Because being made of doped polysilicon allows for easy processing (such as patterning) by an existing technique, the ON-side diode 33, the OFF-side diode 34, the ON-side resistance wiring 39, and the OFF-side resistance wiring 40 can be fabricated with efficiency.

The ON-side diode 33 is, as shown in FIG. 7A, disposed near the ON-side contact portion 29 separately from a terminal end portion of said trench 27, and the ON-side resistance wiring 39 is disposed between the ON-side diode 33 and the ON-side contact portion 29. On the other hand, the OFF-side diode 34 is, as shown in FIG. 7B, disposed near the OFF-side contact portion 30 separately from a terminal end portion of said trench 27, and the OFF-side resistance wiring 40 is disposed between the OFF-side diode 34 and the OFF-side contact portion 30.

The ON-side diode 33, as shown in FIGS. 8A and 8B, includes a p-type portion 41 as an example of a central portion of the present invention being in a circular shape and an n-type portion 42 as an example of a peripheral edge portion of the present invention being in a quadrangular ring shape enclosing the entire circumference of said p-type portion 41 for example, and a p-n junction is formed along an outer periphery of the p-type portion 41.

Similarly, the OFF-side diode 34, as shown in FIGS. 9A and 9B, includes a p-type portion 43 as an example of a central portion of the present invention being in a circular shape and an n-type portion 44 as an example of a peripheral edge portion of the present invention being in a quadrangular ring shape enclosing the entire circumference of said p-type portion 43 for example, and a p-n junction is formed along an outer periphery of the p-type portion 43.

As above, the p-n junctions are formed across the entire circumferences of the respective central portions (p-type portions 41 and 43) of the ON-side diode 33 and the OFF-side diode 34, so that the occurrence of a leak current from the ON-side diode 33 and the OFF-side diode 34 can be suppressed.

In addition, the p-type portion 41, 43 is not necessarily in a circular shape, and may be in, for example, a triangular shape, a quadrangular shape, etc. Also, the n-type portion 42, 44 is not necessarily in a quadrangular ring shape, and may be in, for example, a circular ring shape.

Further, the entire circumference of the p-type portion 41, 43 may not be enclosed by the n-type portion 42, 44. For example, as shown in FIG. 8C and FIG. 9C, an arch-shaped n-type portion 42, 44 enclosing three sides of a quadrangular-shaped p-type portion 41, 43 may be formed, and a remaining side of the p-type portion 41, 44 may be exposed. This arrangement allows downsizing the ON-side diode 33 and the OFF-side diode 34 by the regions surrounded by broken lines 45, as compared with when the entire circumference of the p-type portion 41, 43 is enclosed. As a result, the degree of freedom in the layout of the ON-side diode 33 and the OFF-side diode 34 can be increased, and the semiconductor device 1 can also be miniaturized.

The ON-side resistance wiring 39, as shown in FIGS. 8A to 8C, extends linearly between the ON-side contact portion 29 and the ON-side diode 33, and has a length $L_{on}$ (for example, 10 μm to 50 μm) and a width $W_{on}$ (for example, 10 μm to 100 μm). Also, as shown in FIG. 7A, the ON-side resistant wiring 39 is disposed so as to overlap the sense side gate electrode 37 within the ON-side contact portion 29, and connected to the sense side gate electrode 37.

Similarly, the OFF-side resistance wiring 40, as shown in FIGS. 9A to 9C, extends linearly between the OFF-side contact portion 30 and the OFF-side diode 34, and has a length $L_{off}$ (for example, 10 μm to 50 μm) and a width $W_{off}$ (for example, 10 μm to 100 μm). Also, as shown in FIG. 7B, the OFF-side resistant wiring 40 is disposed so as to overlap the sense side gate electrode 37 within the OFF-side contact portion 30, and connected to the sense side gate electrode 37.

In the present preferred embodiment, the width $W_{on}$ of the ON-side resistance wiring 39 and the width $W_{off}$ of the OFF-side resistance wiring 40 are the same as each other. On the other hand, regarding the length, the length $L_{on}$ of the ON-side resistance wiring 39 is shorter than the length $L_{off}$ of the OFF-side resistance wiring 40. That is, when the ON-side resistance wiring 39 and the OFF-side resistance wiring 40 are compared, a resistance value $R_{g1}$ (first resistance value) of the ON-side resistance wiring 39 having a relatively short length $L_{on}$ is smaller than a resistance value $R_{g2}$ (second resistance value) of the OFF-side resistance wiring 40 having a length $L_{off}$ longer than the length $L_{on}$. In the present preferred embodiment, the resistance value $R_{g1}$ of the ON-side resistance wiring 39 is, for example, 1Ω to 50Ω. On the other hand, the resistance value $R_{g2}$ of the OFF-side resistance wiring 40 is 400Ω to 600Ω. In addition, the resistance value $R_{g1}$ is preferably the same as a resistance value $R_{gs}$ of the sense side gate electrode 37 and a resistance value $R_{gm}$ of the main side gate electrode 38.

An interlayer insulating film 50 is formed so as to cover substantially the entirety of the front surface region of the semiconductor substrate 2. The interlayer insulating film 50 is made of, for example, $SiO_2$. In addition, the interlayer insulating film 50 has a thickness of, for example, 3000 Å to 8000 Å (in the present preferred embodiment, 6000 Å). In the interlayer insulating film 50, various contact holes 52 to 59 are formed.

The main emitter electrode 6, the gate wiring 7, and the sense emitter electrode 8 are formed on the interlayer insulating film 50. As shown in FIG. 5, the main emitter electrode 6 and the sense emitter electrode 8 are connected to the $n^+$-type emitter regions 47 and 46 and the $p^+$-type base contact regions 49 and 48 via the contact holes 53 and 52, respectively.

As shown in FIGS. 7A and 7B, to the p-type portion 41 of the ON-side diode 33 exposed from the contact hole 56, the distal end portion of the ON-side finger 15 is connected. On the other hand, the n-type portion 42 exposed from the contact hole 57 is connected to an ON-side contact wiring 60 as an example of a first contact wiring of the present invention connected to the ON-side resistance wiring 39 via the contact hole 54.

To the n-type portion 44 of the OFF-side diode 34 exposed from the contact hole 59, the distal end portion of the OFF-side finger 16 is connected. On the other hand, the p-type portion 43 exposed from the contact hole 58 is connected to an OFF-side contact wiring 61 as an example of a second contact wiring of the present invention connected to the OFF-side resistance wiring 40 via the contact hole 55. In addition, the ON-side contact wiring 60 and the OFF-side contact wiring 61 are, in the present preferred embodiment, constructed as the electrode film 9 described above.

As above, the ON-side diode 33 is connected at an anode side (p-side) to the gate wiring 7, and the OFF-side diode 34 is connected at a cathode side (n-side) to the gate wiring 7. That is, the ON-side diode 33 is connected in a forward direction with respect to a positive gate voltage (reverse direction with respect to a negative gate voltage), and the OFF-side diode 34 is connected in a reverse direction with respect to a positive gate voltage (forward direction with respect to a negative gate voltage). It can thereby be selectively designated according to the polarity (positive/negative) of a voltage that is applied to the gate electrode 37, 38 whether through a channel that is through the ON-side diode 33 or a channel that is through the OFF-side diode 34 a sense gate voltage is applied.

The shapes of the distal end portion of the ON-side finger 15 (OFF-side finger 16) and the ON-side contact wiring 60 (OFF-side contact wiring 61) will be described in greater detail.

First, as shown in FIG. 8A, the distal end portion of the ON-side finger 15 is formed along the outer periphery of the p-type portion 41 in the center, and in the present preferred embodiment, formed in a circular shape. The contact hole 56 is also similarly formed in a circular shape.

The ON-side contact wiring 60 is formed in a ring shape to enclose the distal end portion of its ON-side finger 15, and connected to the n-type portion 42 via the contact hole 57 formed along the periphery of distal end portion of the ON-side finger 15. A separation region 62 is formed in a part of the ON-side contact wiring 60. The ON-side finger 15 is, via the separation region 62, accessible to the p-type portion 41 located in the central portion of the ON-side diode 33.

On the other hand, the distal end portion of the OFF-side finger 16 and the OFF-side contact wiring 61 have shapes identical to the shapes of the distal end portion of the ON-side finger 15 and the ON-side contact wiring 60 that have been rotated 180°. Specifically, as shown in FIG. 9A, an end portion of the OFF-side contact wiring 61 is formed along the outer periphery of the p-type portion 43 in the center, and in the present preferred embodiment, formed in a circular shape. The contact hole 58 is also similarly formed in a circular shape.

The distal end portion of the OFF-side finger 16 is formed in a ring shape to enclose an end portion of its OFF-side contact wiring 61, and connected to the n-type portion 44 via the contact hole 59 formed along the periphery of the end portion of the OFF-side contact wiring 61. A separation region 64 is formed in a part of the OFF-side finger 16. The OFF-side contact wiring 61 is, via the separation region 64, accessible to the p-type portion 43 located in the central portion of the OFF-side diode 34.

The electrode film 9 including the main emitter electrode 6, the gate wiring 7, the sense emitter electrode 8, the ON-side contact wiring 60, and the OFF-side contact wiring 61 is made of, for example, an Al—Si—Cu-based alloy. Also, between the semiconductor substrate 2 and the electrode film 9, a barrier film (not shown) having, for example, a Ti/TiN/Ti laminated structure may be interposed.

A collector electrode 10 formed on the back surface of the semiconductor substrate 2 has an AlSi/Ti/Ni/Au laminated structure laminated in order from the back surface. The collector electrode 10, as shown in FIG. 5, serves as a common electrode between the sense cells 31 and the main cells 32.

An equivalent circuit of the semiconductor device 1 having been described above is shown in FIG. 10. In the equivalent circuit, to the sense cell 31, a sense current that is on the order of $\frac{1}{2000}$ (absolute value) of a main current flowing to the main cell 32 can be made to flow.

Moreover, according to the semiconductor device 1, with respect to a positive gate voltage, the ON-side diode 33 is connected in a forward direction, and the OFF-side diode 34 is connected in a reverse direction. It can thereby be selectively designated according to the polarity (positive/negative) of a voltage that is applied to the gate electrode 37, 38 whether through a channel of the ON-side diode 33 using the ON-side finger 15 or a channel of the OFF-side diode 34 using the OFF-side finger 16 a sense gate voltage is applied.

Because the ON-side diode 33 channel becomes conductive when turning on the main cell 32, at the turn-on time, a sense gate voltage is applied through the ON-side resistance wiring 39 having a short wiring length $L_{on}$ compared to that of the OFF-side resistance wiring 40. The resistance value $R_{g1}$ of the ON-side resistance wiring 39 can thus be made substantially the same as the resistance value $R_{gm}$ of the main side gate electrode 38. Therefore, a timing at which the sense cell 31 is turned on can be substantially synchronized with a timing at which the main cell 32 is turned on. As a result, a phase shift (phase difference) therebetween can be reduced, so that flow of an unexpected overcurrent to the sense cell 31 can be suppressed. Accordingly, current noise at the turn-on time can be reduced.

On the other hand, at the turn-off time of the main cell 32, the OFF-side diode 34 channel becomes conductive, and a sense gate voltage is applied through the highly resistant OFF-side resistance wiring 40 having a long wiring length $L_{off}$ compared to that of the ON-side resistance wiring 39. It can thereby be suppressed that a Hall current flows to the sense cell 31 beyond the main cell region 26. Therefore, current noise at the turn-off time can be reduced, and the main cell 32 can be gradually turned off (softly turned off).

Figure 11:
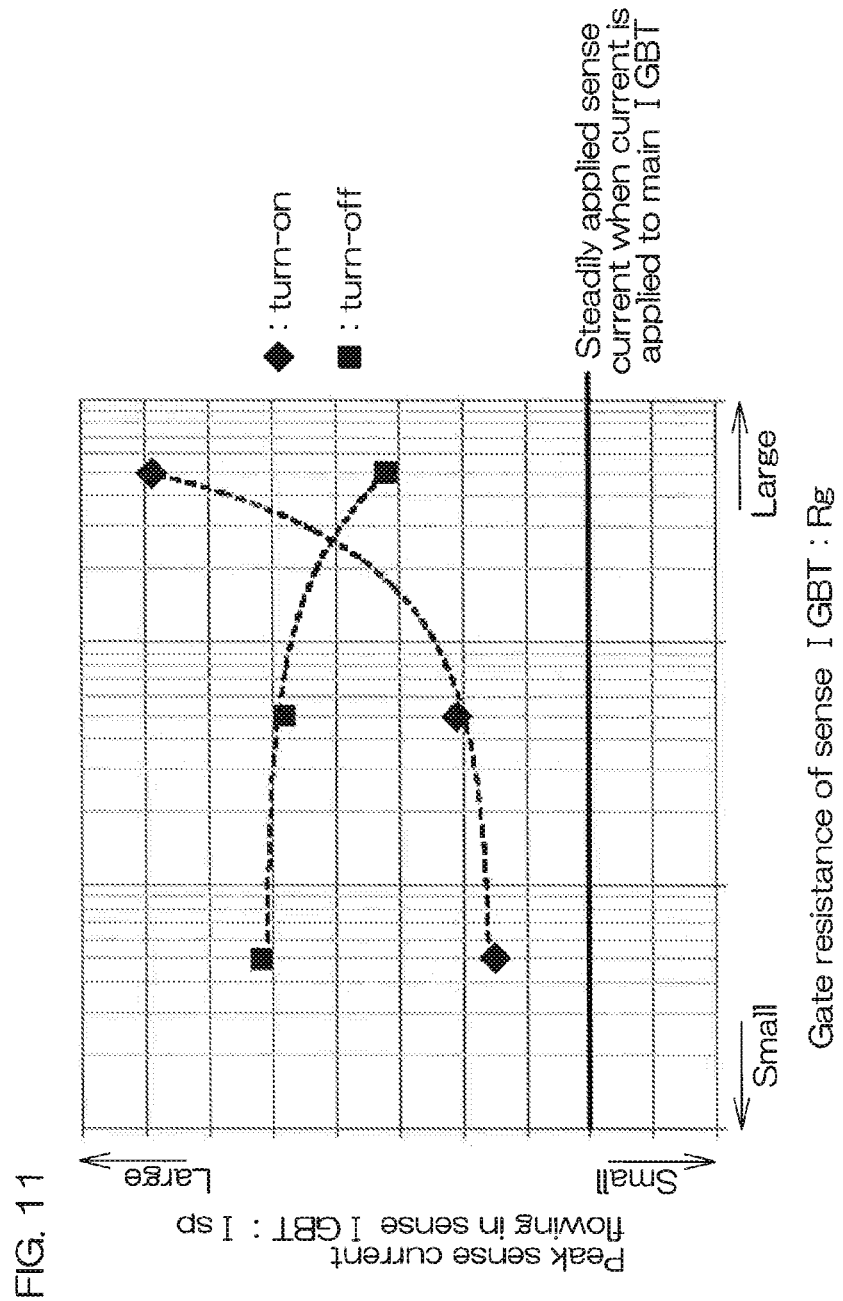
FIG. 11 is a graph showing a relationship between a gate resistance of a sense IGBT cell and a peak sense current flowing in the sense IGBT cell.

The effect to reduce current noise at the turn-on and turn-off time mentioned above can be proved by FIG. 11. FIG. 11 is a graph showing a relationship between a gate resistance of the sense cell 31 and a peak sense current flowing in the sense cell 31.

As shown in FIG. 11, it can be understood that at the turn-on time of the main cell 32, the smaller the gate resistance of the sense cell 31, the smaller the peak sense current (that is, a peak value of current noise). On the other hand, it can be understood that at the turn-off time of the main cell 32, the greater the gate resistance of the sense cell 31, the smaller the peak sense current.

Thus, as in the present preferred embodiment, using the ON-side resistance wiring 39 having a low resistance value $R_{g1}$ as a gate resistance at the turn-on time and, at the turn-off time, using the OFF-side resistance wiring 40 having a high resistance value $R_{g2}$ as a gate resistance allows reducing current noise either at the turn-on or the turn-off time.

As a result of the above, it becomes no longer necessary, in order to avoid the sense cell 31 malfunctioning, to introduce a filter circuit into the semiconductor device 1 and carry out margin design such as setting a high overcurrent detection value in the driver IC 21 (refer to FIG. 1). Because the driver IC 21 can thereby be improved in detection sensitivity, the performance of a system including the semiconductor device 1 of the present invention can be improved.

Figure 12:
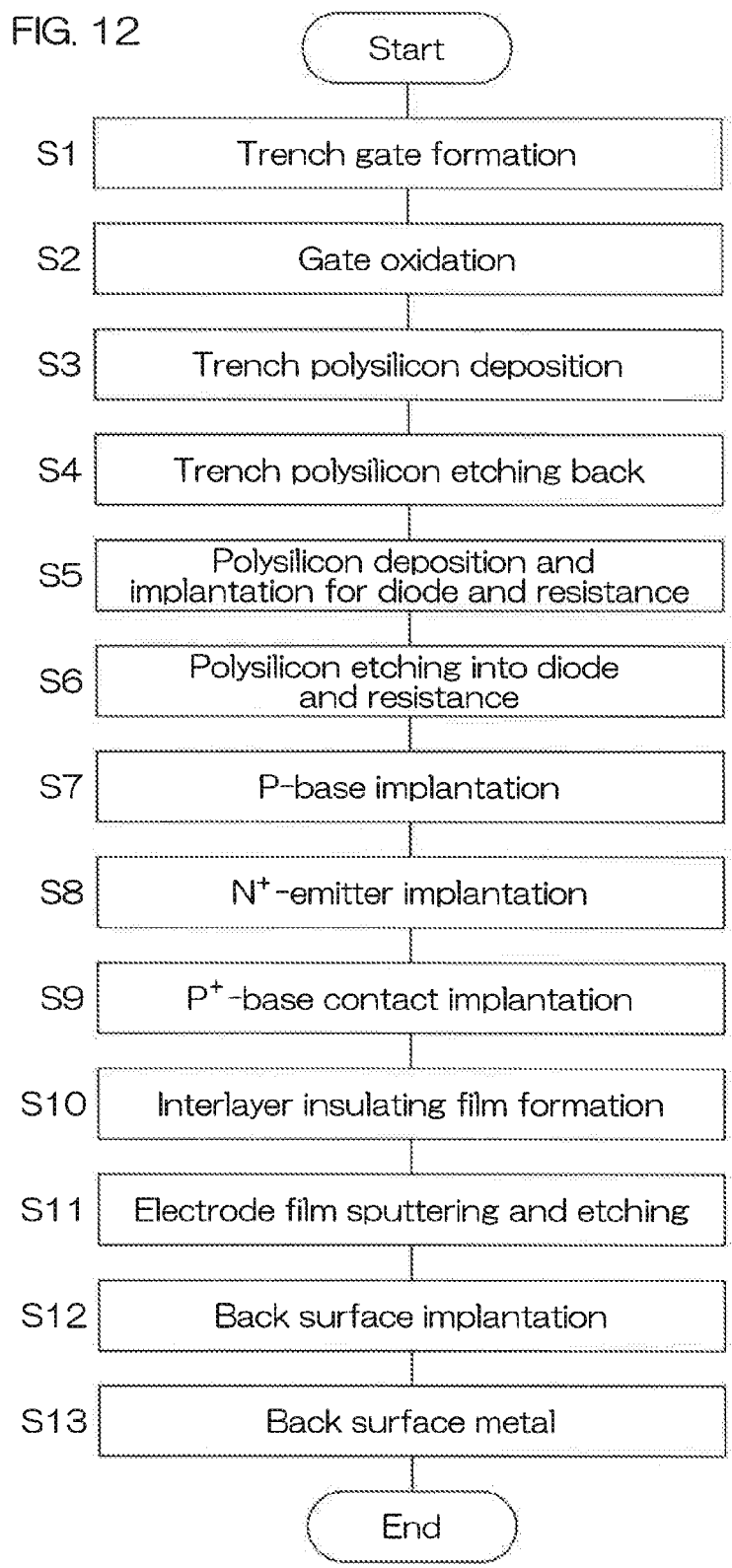
FIG. 12 is a flowchart of a manufacturing process of the semiconductor device.

FIG. 12 is a flowchart of a manufacturing process of the semiconductor device 1. The manufacturing process of the semiconductor device 1 will be described with reference to FIG. 12 and FIG. 5 to FIGS. 7A, 7B, and 7C.

For manufacturing the semiconductor device 1, first, by a semiconductor substrate 2 (n⁻-type drift region 5) being selectively etched, sense side trenches 27 and main side trenches 28 are simultaneously formed (S1).

Next, by the semiconductor substrate 2 being thermally oxidized, a gate insulating film 36 is formed in the entire front surface region including the inner surface of the trenches 27 and 28 (S2).

Next, by, for example, an LPCVD (Low Pressure Chemical Vapor Deposition) method, polysilicon is deposited on the semiconductor substrate 2 (S3). The deposition of polysilicon is continued until the trenches 27 and 28 are completely filled back and the semiconductor substrate 2 is covered with polysilicon.

Next, by said polysilicon being etched back, an unnecessary part of the polysilicon is removed. A sense side gate electrode 37 and a main side gate electrode 38 buried in the respective trenches 27 and 28 are simultaneously formed (S4). Thereafter, by performing thermal oxidation according to necessity, a thermally oxidized film may be formed on an upper surface of the gate electrode 37, 38 (buried polysilicon).

Next, by, for example, an LPCVD (Low Pressure Chemical Vapor Deposition) method, polysilicon is deposited on the semiconductor substrate 2 (S5). Thereafter, into said polysilicon, a p-type dopant and an n-type dopant are respectively selectively ion-implanted.

Next, by the ion-implanted polysilicon being selectively etched, an ON-side diode 33, an OFF-side diode 34, an ON-side resistance wiring 39, and an OFF-side resistance wiring 40 are simultaneously formed (S6).

Next, a p-type dopant is ion-implanted to the front surface of the n⁻-type semiconductor substrate 2, and thereafter, the semiconductor substrate 2 is annealed. The p-type dopant is thereby subjected to drive-in diffusion, and thus a p-type base region 35 is formed (S7).

Next, an n-type dopant is ion-implanted to the front surface of the semiconductor substrate 2, and thereafter, the semiconductor substrate 2 is annealed. The n-type dopant is thereby subjected to drive-in diffusion, and thus n⁺-type emitter regions 46 and 47 are formed (S8).

Next, a p-type dopant is ion-implanted to the front surface of the semiconductor substrate 2, and thereafter, the semiconductor substrate 2 is annealed. The p-type dopant is thereby subjected to drive-in diffusion, and thus p⁺-type base regions 48 and 49 are formed (S9).

Next, an interlayer insulating film 50 is formed on the semiconductor substrate 2 by, for example, a CVD method (S10).

Next, on the semiconductor substrate 2, a material for an electrode film 9 is deposited by, for example, a sputtering method. Then, by patterning said electrode film material, an main emitter electrode 6, a gate wiring 7, a sense emitter electrode 8, an ON-side contact wiring 60, and an OFF-side contact wiring 61 are simultaneously formed (S11).

Next, after the semiconductor substrate 2 is reduced in thickness by grinding from the back surface according to necessity, n-type and p-type dopants are selectively ion-implanted to the back surface of the semiconductor substrate 2, and thereafter, the semiconductor substrate 2 is annealed (in the present preferred embodiment, annealed by laser). The n-type and p-type dopants are thereby subjected to drive-in diffusion, and thus an n-type buffer region 4 and a p$^+$-type collector region 3 are formed (S12).

Thereafter, by depositing an electrode material on the back surface of the semiconductor substrate 2 by, for example, a sputtering method, a collector electrode 10 is formed.

The semiconductor device 1 shown in FIG. 1 to FIGS. 7A, 7B, and 7C is obtained through the steps as above. In addition, the manufacturing process mentioned above merely represents a part of the manufacturing process of the semiconductor device 1, and the manufacturing process of the semiconductor device 1 may include steps that are not described in the above.

Next, description will be given of usage modes of the semiconductor device 1.

<Semiconductor Package>

Figure 13:
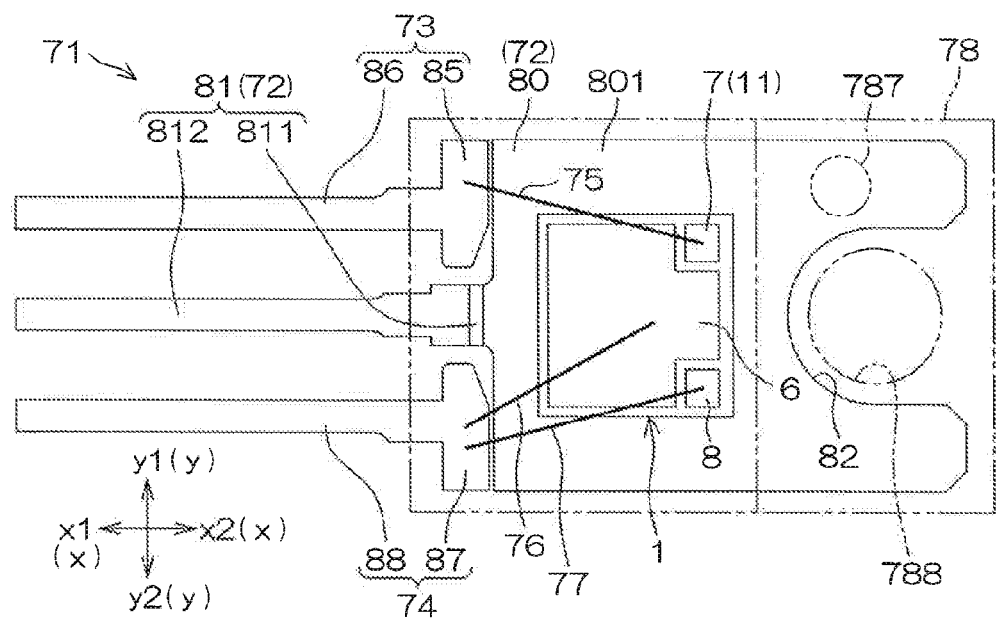
FIG. 13 is a schematic plan view of a semiconductor package according to a preferred embodiment of the present invention.
Figure 14:
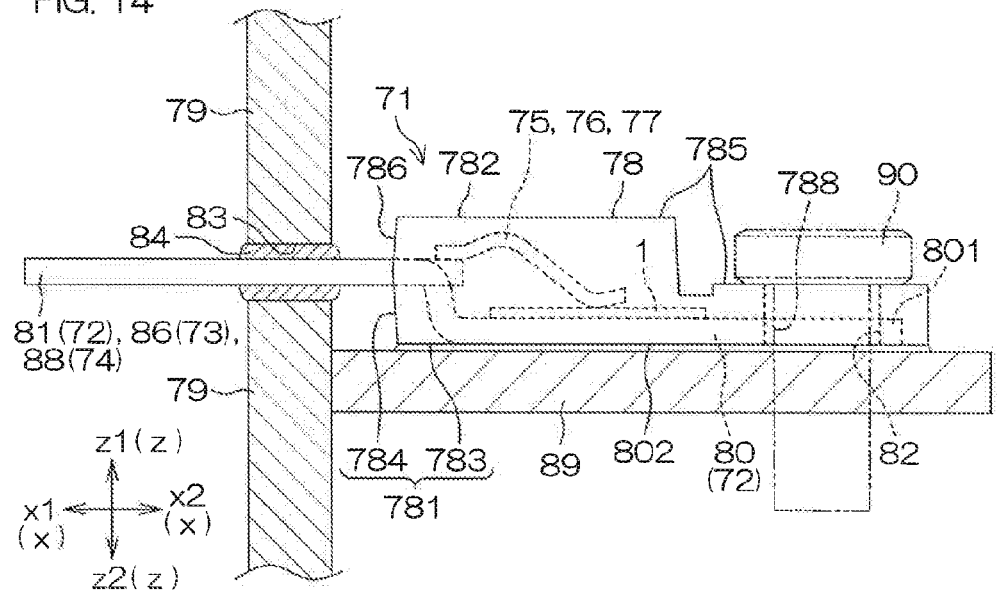
FIG. 14 is a sectional view showing a mounting structure of the semiconductor package in FIG. 13.

FIG. 13 is a schematic plan view of a semiconductor package 71 into which the semiconductor device 1 is incorporated. FIG. 14 is a sectional view showing a mounting structure of the semiconductor package 71 in FIG. 13.

The semiconductor package 71 includes a semiconductor device 1 and electrodes 72 to 74, wires 75 to 77 and a resin package 78. In FIG. 13, the resin package 78 is shown by alternate long and two short dashed lines. The semiconductor package 71 is mounted on a mounting substrate 79. As shown in FIG. 14, the semiconductor package 71 is used as an electronic component that performs a switching function, a rectifying function, an amplifying function, or the like, in an electrical circuit depending on the type of the semiconductor device 1.

The electrode 72 includes a die bonding pad 80 and a lead 81. The die bonding pad 80 and the lead 81 are made of, for example, a conductive material such as copper.

The die bonding pad 80 is for loading the semiconductor device 1. The die bonding pad 80 is in a flat plate shape. The die bonding pad 80 has an arrangement surface 801 and a back surface 802. The arrangement surface 801 faces in a direction z1. The back surface 802 faces in a direction z2. On the arrangement surface 801, the semiconductor device 1 is disposed. Heat generated in the semiconductor device 1 is transferred to the die bonding pad 80. In the die bonding pad 80, a hole 82 that penetrates from the arrangement surface 801 to the back surface 802 is formed. As shown in FIG. 13, the hole 82 may have a shape, in an x-y plane view, recessed in a direction x1 from an end portion at a side in a direction x2 of the die bonding pad 80.

The lead 81 has a shape linearly extending from the die bonding pad 80. The lead 81 is for insertion mounting. As shown in FIG. 14, the lead 81 is inserted into a hole 83. The semiconductor package 71 is thereby mounted on the mounting substrate 79. The hole 83 is filled with solder 84 in order to fix the lead 81 to the mounting substrate 79. As shown in FIG. 13, the lead 81 has a coupling portion 811 and a terminal portion 812. The coupling portion 811 and the terminal portion 812 may be integrally molded.

The coupling portion 811 connects to the die bonding pad 80. The coupling portion 811 has a shape extending from the die bonding pad 80 in a direction to cross the arrangement surface 801. The terminal portion 812 connects to the coupling portion 811. The terminal portion 812 extends from the coupling portion 811 in the direction x1. The terminal portion 812 has a part projecting from the resin package 78.

The electrode 73 includes a wire bonding pad 85 and a lead 86. The electrode 73 is positioned, in an x-y plane view, on a side in the direction x1 of the die bonding pad 80 and on a side in a direction y1 of the lead 81.

The wire bonding pad 85 and the lead 86 may be integrally molded. The wire bonding pad 85 and the lead 86 are made of, for example, a conductive material such as cooper. The wire bonding pad 85 has a substantially rectangular flat plate shape smaller than the die bonding pad 80. The lead 86 connects to the wire bonding pad 85. The lead 86 has a shape linearly extending from the wire bonding pad 85 in the direction x1. The lead 86 is in juxtaposition to the lead 81. The lead 86 has a part projecting from the resin package 78. The lead 86 is for insertion mounting. As shown in FIG. 14, the lead 86 is inserted into the hole 83. The semiconductor package 71 is thereby mounted on the mounting substrate 79. The hole 83 is filled with solder 84 in order to fix the lead 86 to the mounting substrate 79.

The electrode 74 includes a wire bonding pad 87 and a lead 88. The electrode 74 is positioned, in an x-y plane view, on a side in the direction x1 of the die bonding pad 80 and on a side in a direction y2 of the lead 81.

The wire bonding pad 87 and the lead 88 may be integrally molded. The wire bonding pad 87 and the lead 88 are made of, for example, a conductive material such as cooper. The wire bonding pad 87 has a substantially rectangular flat plate shape smaller than the die bonding pad 80. The lead 88 connects to the wire bonding pad 87. The lead 88 has a shape linearly extending from the die bonding pad 87 in the direction x1. The hole 83 is filled with solder 84 in order to fix the lead 88 to the mounting substrate 79. The lead 88 is in juxtaposition to the lead 81. Between the lead 88 and the lead 86, the lead 81 is positioned. The lead 88 has a part projecting from the resin package 78. The lead 88 is for insertion mounting. As shown in FIG. 14, the lead 88 is inserted into the hole 83. The semiconductor package 71 is thereby mounted on the mounting substrate 79.

Referring mainly to FIG. 14, the resin package 78 covers the semiconductor device 1 and the electrodes 72 to 74. The resin package 78 is made of, for example, a black epoxy resin. As shown in FIG. 14, the resin package 78 has a first surface 781 and a second surface 782.

The first surface 781 has a flat surface 783 and a tapered surface 784. As shown in FIG. 14, the flat surface 783 is a mounting surface for mounting the semiconductor package 71 on the mounting substrate 79. From the flat surface 783, the back surface 802 of the die bonding pad 80 is exposed. The flat surface 783 may be flush with the back surface 802, and may not be flush with the back surface 802. The tapered surface 784 continues to the flat surface 783. The tapered surface 784 has a shape heading to the outside in an x-y plane gradually in the direction z1.

The second surface 782 has a plurality of flat surfaces 785 and a plurality of tapered surfaces 786. The respective tapered surfaces 786 connect to any of the plurality of flat surfaces 785. The respective tapered surfaces 786 have shapes heading to the outside in an x-y plane gradually in the direction z2. The respective tapered surfaces 786 connect to the tapered surface 784.

In the resin package 78, a pin trace 787 that is recessed from one of the plurality of flat surfaces 785 is formed. Also, in the resin package 78, a screw hole 788 is formed. Through the screw hole 788, a screw 90 to fix the semiconductor package 71 to a heat dissipation plate 89 is inserted.

The wires 75 to 77 are made of, for example, a metal such as aluminum. The wire 75 is bonded to the gate wiring 7 of the semiconductor device 1 and the wire bonding pad 85.

The gate wiring 7 and the wire bonding pad 85 are thereby conductive. The wire 76 is bonded to the main emitter electrode 6 of the semiconductor device 1 and the wire bonding pad 87. The main emitter electrode 6 and the wire bonding pad 87 are thereby conductive. The wire 77 is bonded to the sense emitter electrode 8 of the semiconductor device 1 and the wire bonding pad 87. The sense emitter electrode 8 and the wire bonding pad 87 are thereby conductive.

<Semiconductor Module>

Figure 15:
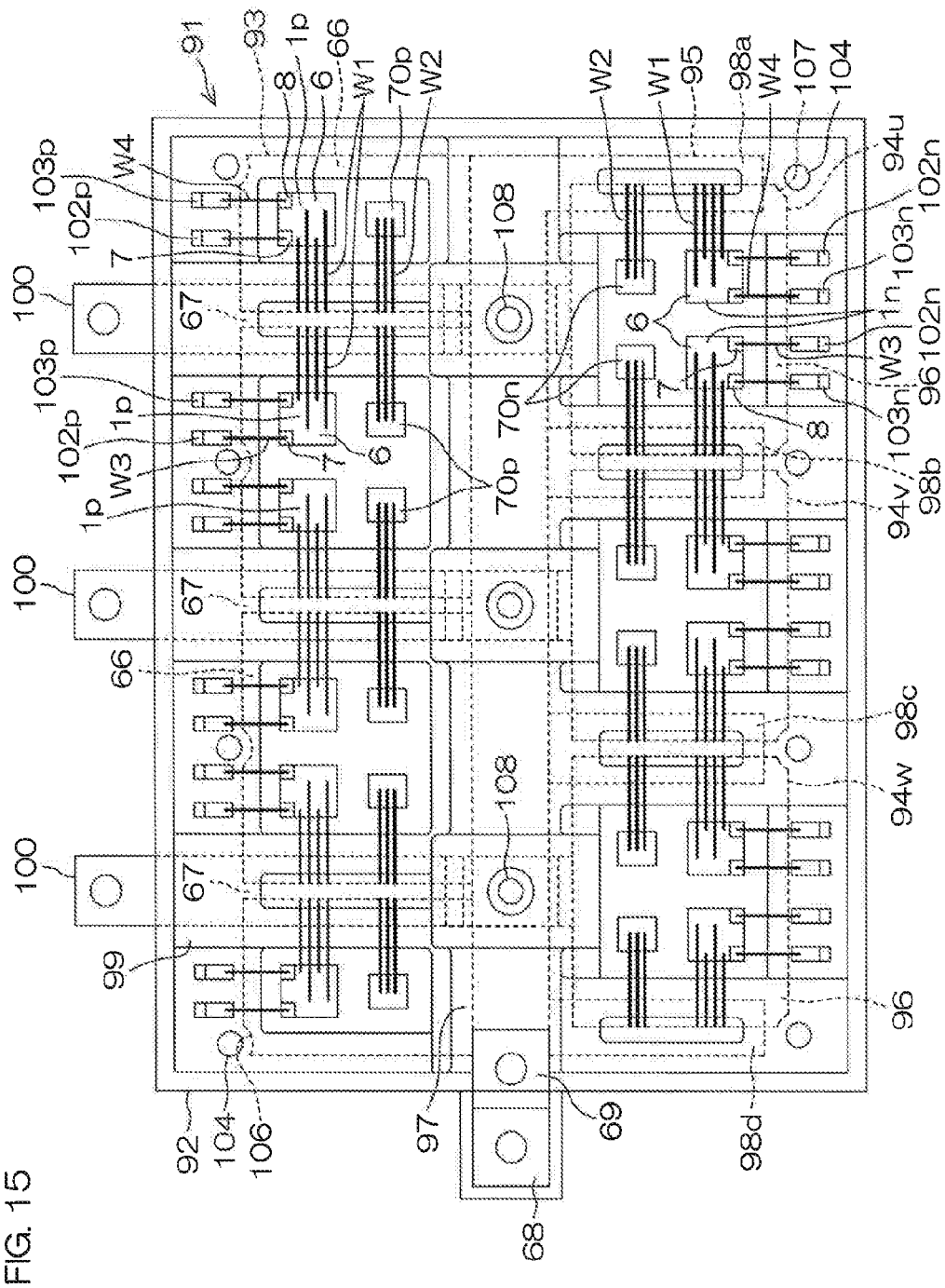
FIG. 15 is a schematic plan view of a semiconductor module according to a preferred embodiment of the present invention.
Figure 16:
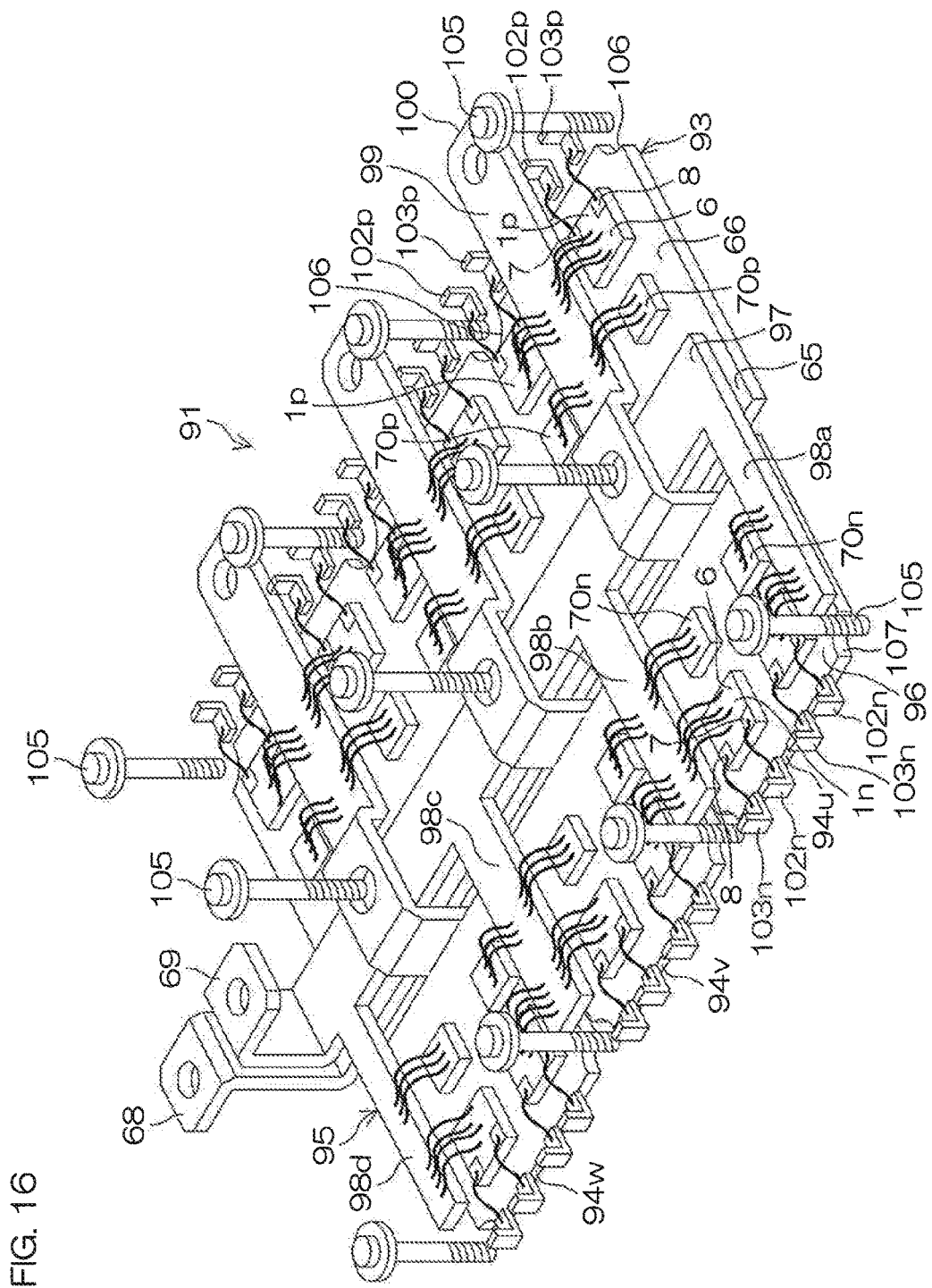
FIG. 16 is a view showing a part of the semiconductor module in FIG. 15.
Figure 17:
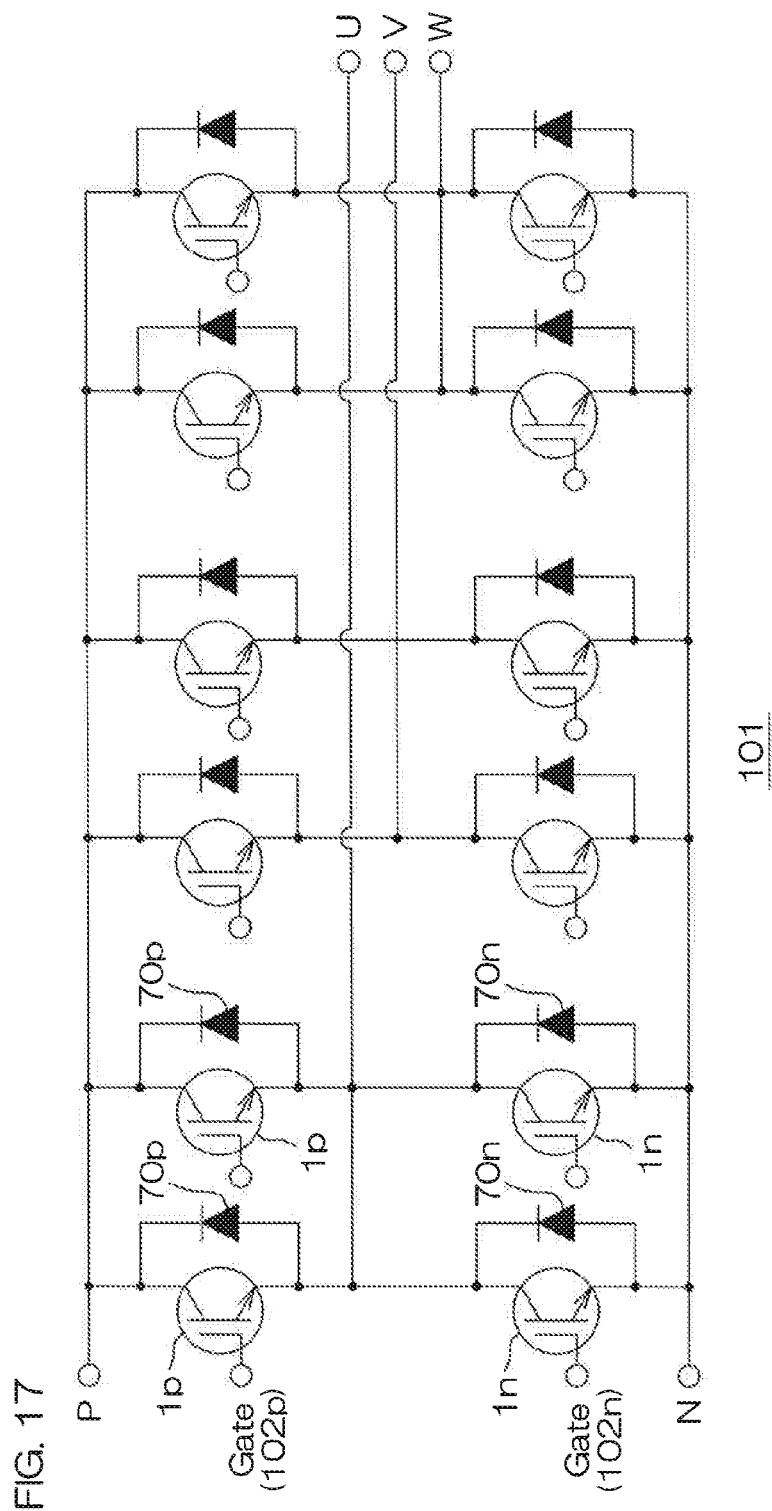
FIG. 17 is a diagram showing an inverter circuit constituted by the semiconductor module in FIG. 15.

FIG. 15 is a schematic plan view of a semiconductor module 91 into which the semiconductor device 1 is incorporated. FIG. 16 is a view in which a resin-made base portion 92 of the semiconductor module 91 in FIG. 15 is omitted. FIG. 17 is a diagram showing an inverter circuit 101 constituted by the semiconductor module 91 in FIG. 15.

The semiconductor module 91 includes mainly abase portion 92 made of resin, electrode plates 93 and 94 (94*u*, 94*v*, and 94*w*), and 95 made of metal.

The base portion 92 is formed in a case shape showing an oblong shape in a plan view, and is opened upward. The electrode plates 93 to 95 may be made of, for example, Cu (copper), Al (aluminum), or an alloy of Cu and Al.

The semiconductor module 91 is constructed by molding the electrode plates 93 to 95 on the base portion 92. The semiconductor module 91 may be fixed (for example, screwed) to a heat sink via a heat dissipation sheet.

The resin electrode plates 94*u*, 94*v*, and 94*w* are arranged side by side with their respective low step portions 96 provided with a gap therebetween, and the electrode plate 93 is disposed opposite to end edges of the respective low step portions 96 of the side-by-side electrode plates 94.

The electrode plate 95 may have a communicating portion 97 extending in the direction in which the electrode plates 94*u*, 94*v*, and 94*w* are arranged and extending portions 98 (98*a*, 98*b*, 98*c*, and 98*d*) provided at predetermined intervals from the communicating portion 97. The communicating portion 97 overlaps, along an end edge of the electrode plate 93 opposed to the respective low step portions 96 of the electrode plates 94, the electrode plate 93 at a predetermined clearance thereover. Moreover, the extending portions 98 overlap respective sides of the metal electrode plates 94*u*, 94*v*, and 94*w*. Accordingly, the extending portion 98*b* extends along a gap between the electrode plates 94*u* and 94*v* with a width across both plates, and the extending portion 98*c* extends along a gap between the electrode plates 94*v* and 94*w* with a width across both plates.

The electrode plates 94 respectively include narrow-width high step portions 99 extending from widthwise central portions of end edges opposed to the electrode plate 93 of their low step portions 96. The high step portion 99 with an upward offset climbs over the communicating portion 97 of the electrode plate 95 and then extends over the electrode plate 93 with a predetermined clearance at the same height (the same layer) as that of the electrode plate 95, and a distal end of the high step portion 99 projects as an external connection portion 100 laterally from the base portion 92 to be exposed.

The electrode plate 93 similarly includes a communicating portion 65 in a region overlapped by the communicating portion 97 of the electrode plate 95, and has a slit 67 in a main portion 66 overlapped by the high step portion 99 of the electrode plate 94. The slit 67 has a narrow width, and the high step portion 99 of the electrode plate 94 extends with a width over the slit 67.

The communicating portion 65 of the electrode plate 93 and the communicating portion 97 of the electrode plate 95 are bent perpendicularly upward with a clearance therebetween maintained respectively at one-end sides (here, the side of the extending portion 98*d*) to extend upward from the base portion 92, and are then bent as external connection portions 68 and 69 in mutually opposite directions and parallel to the communicating portions 65 and 97.

In terms of a phase (for example, a u-phase) of the inverter circuit 101, on the main portion 66 of the electrode plate 93 located on a bottom surface of the base portion 92, one set each of semiconductor devices (IGBTs) 1*p* and FWDs 70*p*, a total of two sets, are bonded, across the high step portion 99 of the electrode plate 94 (94*u*), by solder that is a conductive bonding material on both sides along the high step portion 99.

Similarly, also on the low step portion 96 of the electrode plate 94 in the bottom surface of the base portion 92, in a region enclosed in a U-shape by the communicating portion 97 and the extending portions 98 (98*a* and 98*b*) of the electrode plate 95, one set each of semiconductor devices (IGBTs) 1*n* and FWDs 70*n* are bonded by solder along the respective extending portions.

Further, at an opening side in the region enclosed in an U-shape near the electrode plate 94*u*, gate terminals 102*n* and sense emitter terminals 103*n* are molded on the base portion 92 in a manner corresponding to the sets of the semiconductor devices 1*n* and the FWD 70*n*. On a side opposite to the communicating portion 65 near the electrode plate 93, gate terminals 102*p* and sense emitter terminals 103*p* are molded on the base portion 92 in a manner corresponding to the sets of the semiconductor devices 1*p* and the FWD 70*p*.

The semiconductor device 1 uses its solder bonded surface as a collector, and the main emitter electrode 6 on an upper surface of the semiconductor device 1*p* located on the electrode plate 93 is connected to the high step portion 99 of the electrode plate 94*u* by a plurality of metal wires W1. Also, the gate wiring 7 on the upper surface of the semiconductor device 1*p* is connected with the gate terminal 102*p* by a metal wire W3. Also, the sense emitter electrode 8 on the upper surface of the semiconductor device 1 is connected with the sense emitter terminal 103*p* by a metal wire W4.

The FWD 70 uses its solder bonded surface as a cathode, and an anode electrode on an upper surface thereof is connected to the high step portion 99 by a plurality of metal wires W2.

The main emitter electrode 6 on an upper surface of the semiconductor device 1*n* located on the metal electrode plate 94*u* is connected to the extending portion 98 (98*a*, 98*b*) of the electrode plate 95 by a plurality of metal wires W1, and the gate wiring 7 is connected with a gate terminal 102*n* by a metal wire W3, and the sense emitter electrode 8 is connected with a sense emitter terminal 103*n* by a metal wire W4. Also, the anode electrode at an upper surface of the FWD 70*n* is connected to the extending portion 98 by a plurality of metal wires W2.

The same applies to other phases, and the inverter circuit 101 shown in FIG. 17 is thereby formed. In addition, FIG. 17 is an illustration in which a circuit configuration of a sense emitter is omitted.

The external connection portion 68 of the electrode plate 93 serves as a P terminal of circuit input, and the external connection portion 69 of the electrode plate 95 serves as an N terminal, and the respective external connection portions 100 of the electrode plates 94 (94*u*, 94*v*, and 94*w*) serve as output terminals U, V, and W. The input/output terminals are further connected to a bus bar or high-current cable (not shown) in an inverter device. Also, the gate terminals 102p and 102n and the sense emitter terminals 103p and 103n are connected to, for example, a drive signal output terminal (not shown) of a drive signal control board that is attached onto the base portion 92 of the semiconductor module 91.

In corner portions of the base portion 92, middle portions between the high step portions 99, and near distal ends of the extending portions 98, screw holes 104 are provided to make screws 105 for fixing the semiconductor module 91 to a heat sink (not shown) insertable therethrough. In the electrode plate 93 and the low step portions 96 of the electrode plates 94, cut-aways 106 and 107 are formed so as to have a predetermined clearance with the screw hole 104, and an inner wall of the screw holes 104 is provided as a molding resin so as to be insulated from the screw 105.

Also, in a central portion of the semiconductor module 91, screw through-holes 108 are provided in the high step portions 99 of the electrode plates 94 and the overlapping part of the communicating portions 97 and 65 of the electrode plates 95 and 93 to make screws 105 insertable therethrough, which is the same as with a peripheral portion. Also around the screw through-holes 108, in the high step portions 99 and the communicating portions 65 and 97, holes that are larger in diameter than the screw through-holes 108 are formed, and an inner wall of the screw through-holes 108 is provided as a molding resin so as to be insulated from the screw 105.

Although preferred embodiments of the present invention have been described above, the present invention can be embodied in other forms.

For example, an arrangement may be adopted in which the conductivity type of each semiconductor part of the semiconductor device 1 is inverted. That is, in the semiconductor device 1, the p-type parts may be n-type and the n-type parts may be p-type.

Also, in the foregoing preferred embodiment, the difference between the resistance value $R_{g1}$ of the ON-side resistance wiring 39 and the resistance value $R_{g2}$ of the OFF-side resistance wiring 40 is provided by the lengths $L_{on}$ and $L_{off}$ of the resistance wirings 39 and 40, however, a relationship of $R_{g1} < R_{g2}$ may be provided by making the width $W_{on}$ of the ON-side resistance wiring 39 wider than the width $W_{off}$ of the OFF-side resistance wiring 40.

Also, in the foregoing preferred embodiment, only the arrangement of the IGBT included in the semiconductor device 1 is illustrated, however, a semiconductor device of the present invention may include elements other than the IGBTs (for example, MOSFETs, diodes, and the like) in a region different from a region where the IGBTs are formed.

Also, in the foregoing preferred embodiment, only the form of an IGBT having a trench gate structure is mentioned, however, the present invention can also be applied to an IGBT having a planar gate structure. In this case, it suffices to provide an ON-side resistance electrode (wiring) having a relatively wide width and an OFF-side resistance electrode (wiring) having a relatively narrow width compared to that of the ON-side resistance electrode by becoming creative with the pattern of a gate electrode to be formed on the semiconductor substrate 2.

The semiconductor device of the present invention can be incorporated in, for example, a power module for use in an inverter circuit that constitutes a drive circuit for driving an electric motor available as a power source for an electric vehicle (including a hybrid vehicle), an electric train, an industrial robot, and the like (for example, the semiconductor module 91 and the like in FIG. 15 and FIG. 16). Additionally, the semiconductor device of the present invention can also be incorporated in a power module for use in an inverter circuit that converts electric power generated by a solar cell, a wind power generator, and other power generators (particularly, private electric generators) so as to be matched with electric power from commercial power sources.

Various other design modifications can be made within the scope of the matters described in the claims.

What is claimed is:

1. A semiconductor device comprising:
    a semiconductor layer including a main insulated-gate bipolar transistor (IGBT) cell and a sense IGBT cell connected in parallel to each other;
    a first resistance portion having a first resistance value formed using a gate wiring portion of the sense IGBT cell and a second resistance portion having a second resistance value higher than the first resistance value;
    a gate wiring electrically connected through mutually different channels to the first resistance portion and the second resistance portion;
    a first diode provided between the gate wiring and the first resistance portion;
    a second diode provided between the gate wiring and the second resistance portion in a manner oriented reversely to the first diode;
    an emitter electrode disposed on the semiconductor layer, electrically connected to an emitter of the main IGBT cell; and
    a sense emitter electrode disposed on the semiconductor layer, electrically connected to an emitter of the sense IGBT cell.

2. The semiconductor device according to claim 1, wherein the gate wiring portion of the sense IGBT cell includes a gate electrode formed with a predetermined wiring pattern to divide the sense IGBT cell into respective cell units, and
    the first resistance portion and the second resistance portion are disposed on peripheral edge portions of the gate electrode, respectively.

3. The semiconductor device according to claim 2, wherein the gate electrode includes a striped pattern, and
    the first resistance portion and the second resistance portion are disposed on one end portion of the gate electrode in the striped pattern and the other end portion on a side opposite to the one end portion, respectively.

4. The semiconductor device according to claim 1, wherein the first resistance portion has a short wiring length compared to that of the second resistance portion.

5. The semiconductor device according to claim 1, wherein the first resistance portion has a wide wiring width compared to that of the second resistance portion.

6. The semiconductor device according to claim 1, wherein the first diode is formed of a first deposition layer disposed on the semiconductor layer, having a central portion of a first conductivity type and a peripheral edge portion of a second conductivity type enclosing the central portion, and
    the second diode is formed of a second deposition layer disposed on the semiconductor layer, having a central portion of a first conductivity type and a peripheral edge portion of a second conductivity type enclosing the central portion.

7. The semiconductor device according to claim 6, wherein any one or both of the peripheral edge portion of the first deposition layer and the peripheral edge portion of the second deposition layer are formed so as to enclose an entire circumference of the central portion inside thereof, respectively.

8. The semiconductor device according to claim 6, wherein any one or both of the peripheral edge portion of the first deposition layer and the peripheral edge portion of the second deposition layer are formed so as to selectively enclose apart of the central portion inside thereof, respectively.

9. The semiconductor device according to claim 6, wherein any one or both of the first deposition layer and the second deposition layer is made of doped polysilicon.

10. The semiconductor device according to claim 6, wherein the gate wiring is connected to the central portion of the first deposition layer and the peripheral edge portion of the second deposition layer, and
the semiconductor device includes a first contact wiring that connects the peripheral edge portion of the first deposition layer and the first resistance portion and a second contact wiring that connects the central portion of the second deposition layer and the second resistance portion.

11. The semiconductor device according to claim 6, wherein the first resistance portion and the second resistance portion are formed using a deposition layer that is the same as the first deposition layer and the second deposition layer.

12. The semiconductor device according to claim 1, wherein the gate wiring includes a main line portion and a first branching portion and a second branching portion branching off the main line portion, and
the first branching portion and the second branching portion are connected to the first diode and the second diode, respectively.

13. The semiconductor device according to claim 1, comprising a collector electrode disposed on a back surface of the semiconductor layer, being common between the main IGBT cell and the sense IGBT cell.

* * * * *

UNITED STATES PATENT AND TRADEMARK OFFICE
CERTIFICATE OF CORRECTION

PATENT NO.       : 9,659,901 B2
APPLICATION NO.  : 14/710184
DATED            : May 23, 2017
INVENTOR(S)      : Akihiro Hikasa Page 1 of 1

It is certified that error appears in the above-identified patent and that said Letters Patent is hereby corrected as shown below:

In the Claims

Claim 8, Column 19, Lines 8 and 9, change "enclose apart of the central portion inside thereof, respectively." to -- enclose a part of the central portion inside thereof, respectively. --

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*